United States Patent
Kim

(10) Patent No.: US 11,289,337 B2
(45) Date of Patent: Mar. 29, 2022

(54) METHOD OF FORMING PATTERNS

(71) Applicant: SK hynix Inc., Icheon-si (KR)

(72) Inventor: You Song Kim, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/875,515

(22) Filed: May 15, 2020

(65) Prior Publication Data

US 2021/0104409 A1   Apr. 8, 2021

(30) Foreign Application Priority Data

Oct. 7, 2019   (KR) .......................... 10-2019-0124037

(51) Int. Cl.
*H01L 21/308* (2006.01)
*H01L 21/02* (2006.01)
*H01L 21/033* (2006.01)

(52) U.S. Cl.
CPC .... *H01L 21/3086* (2013.01); *H01L 21/02444* (2013.01); *H01L 21/02527* (2013.01); *H01L 21/0337* (2013.01)

(58) Field of Classification Search
CPC ......... H01L 21/31144; H01L 21/31116; H01L 21/02527; H01L 21/0337; H01L 21/3086; H01L 21/02444; H01L 21/027; H01L 21/28141; H01L 21/31105; G03F 7/2022

USPC ....... 438/706, 710, 712, 714, 717, 719, 723, 438/736, 750
See application file for complete search history.

(56) References Cited

U.S. PATENT DOCUMENTS

2014/0162459 A1   6/2014  Trapp et al.
2017/0053802 A1*  2/2017  Park .................. H01L 21/76816
2017/0287702 A1* 10/2017  Ban ................... H01L 27/10817

FOREIGN PATENT DOCUMENTS

KR   1020160019979 A   2/2016

* cited by examiner

*Primary Examiner* — Lan Vinh
(74) *Attorney, Agent, or Firm* — William Park & Associates Ltd.

(57) ABSTRACT

In a method of forming pattern, a target layer is formed on a semiconductor substrate, and pluralities of first spacers having cylindrical shapes protruding from the target layer are formed. A second spacer layer is formed to cover the first spacers, provide interstitial spaces between the first spacers, and provide second inner spaces within first inner spaces of the first spacers, respectively. The second spacer layer is etched to form first opening portions in which the second inner spaces and the interstitial spaces extend into the target layer.

20 Claims, 32 Drawing Sheets

METHOD OF FORMING PATTERNS

CROSS-REFERENCE TO RELATED APPLICATION

The present application claims priority under 35 U.S.C. 119(a) to Korean Patent Application No. 10-2019-0124037, filed on Oct. 7, 2019, which is herein incorporated by reference in its entirety.

BACKGROUND

1. Technical Field

The present disclosure relates generally to a method of manufacturing a semiconductor device and, more particularly, to a method of forming patterns.

2. Related Art

When integrating circuits of electronic devices into a semiconductor substrate, efforts have been made to integrate a larger number of patterns in a limited area. The degree of integration of electronic devices or semiconductor devices has been increased, and efforts have been made to realize fine patterns of smaller sizes. In order to form dense arrays of contact holes having a nanoscale line width of several nanometers (nm) level, various patterning techniques have been attempted.

Due to limitations in image resolution of photolithography equipment, there is a limitation in forming fine patterns below a certain size. It is difficult to form nanoscale fine patterns in a single exposure process. In order to overcome the resolution limitations of a photolithography technology to form dense and finely sized patterns, a technique of overlapping several patterning steps, such as the triple patterning technique, has been attempted.

SUMMARY

The present disclosure provides a method of forming patterns. The method of forming patterns may include forming a target layer on a semiconductor substrate, forming a plurality of first spacers, each of the first spacers having a cylindrical shape protruding from the target layer, forming a second spacer layer formed to cover the first spacers, provide interstitial spaces between the first spacers, and provide second inner spaces within first inner spaces of the first spacers, and etching the second spacer layer to form first opening portions in which the second inner spaces and the interstitial spaces extend into the target layer.

The present disclosure provides a method of forming patterns according to another example. The method of forming patterns may include forming an array of line patterns on a semiconductor substrate, forming a base layer covering the line patterns; forming a target layer on the base layer, forming a plurality of first spacers, each of the first spacers having a cylindrical shape protruding from the target layer, forming a second spacer layer formed to: cover the first spacers, provide interstitial spaces between the first spacers, and provide second inner spaces within first inner spaces of each of the first spacers, respectively, etching the second spacer layer to form first opening portions in which the second inner spaces and the interstitial spaces are extended in the target layer, thereby patterning the target layer, and performing pattern transfer for the first opening portions to the base layer and the line patterns using the target layer pattern as an etching mask.

The present disclosure provides a method of forming patterns according to another example. The method of forming patterns may include forming a target layer and a buffer layer on a semiconductor substrate including a first region and a second region, selectively etching the buffer layer to form a first buffer layer pattern providing second opening portions in the first region and a second buffer layer pattern spaced apart from the first buffer layer in the second region, forming a first spacer layer on the target layer to cover the first and second buffer layer patterns, forming a region blocking pattern exposing the first spacer layer covering the first buffer layer pattern and covering to block the second buffer layer pattern on the spacer layer, etching the first spacer layer portions exposed by the region blocking pattern to form first sub spacers positioned at inner side surfaces of the first buffer layer pattern and having a protruding cylindrical shape, protruding second sub spacer positioned at an outer side surface of the first buffer layer pattern facing the second buffer layer pattern, and a third sub spacer mask extending from the first spacer layer to at least cover the second buffer layer pattern, removing the first buffer layer pattern, forming a second spacer layer formed to cover the first spacers, the second spacer layer providing interstitial spaces between the first spacers and providing second inner spaces within first inner spaces of each of the first spacers, respectively, and etching the second spacer layer to form a first target layer pattern providing first opening portions formed by extending the second inner spaces and the interstitial spaces, a second target layer pattern overlapping the second sub spacer, and a third target layer pattern overlapping the second buffer layer pattern.

DETAILED DESCRIPTION

Figure 1:
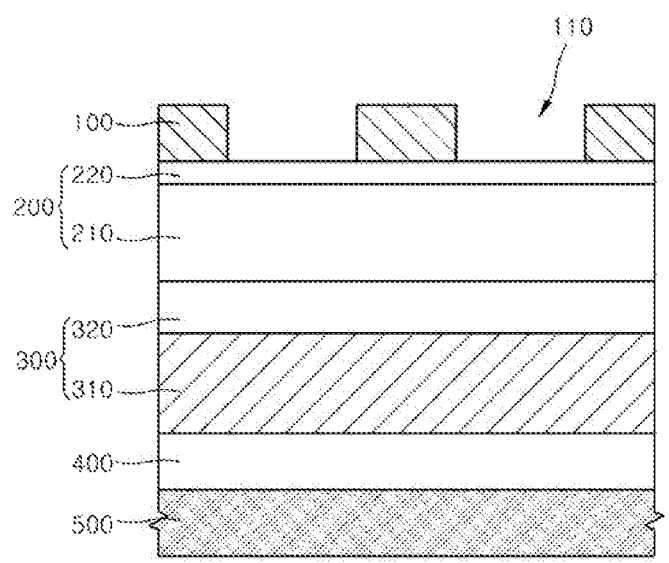
FIGS. 1 to 17 are schematic views illustrating a method of forming patterns according to an embodiment of the present disclosure.

The terms used herein may correspond to words selected in consideration of their functions in the embodiments, and the meanings of the terms may be construed to be different according to the intension or custom of the ordinary skill in the art to which the embodiments belong. If defined in detail, the terms may be construed according to the definitions. Unless otherwise defined, the terms used herein have the same meaning as commonly understood by one of ordinary skill in the art to which the embodiments belong.

In the description of the examples of the present disclosure, the terms such as "first" and "second", "top" and "bottom or lower" are intended to distinguish the members, but not used to limit the members themselves or to mean specific order. The terms mean a relative positional relationship, but do not limit the specific case where another member is further introduced at or directly in contact with the member. The same interpretation can be applied to other expressions describing the relationship between elements.

Hereinafter, various examples of embodiments will be described below with reference to the accompanying drawings. Various examples of the embodiments are described herein with reference to cross-sectional illustrations that are schematic illustrations of the various examples of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Embodiments of the present disclosure may be applied to a technical field for implementing integrated circuits such as dynamic random access memory (DRAM) devices, phase change random access memory (PcRAM) devices, or resistive random access memory (ReRAM) devices. In addition, embodiments of the present disclosure may be applied to a technical field for implementing memory devices such as static random access memory (SRAM) devices, flash memory devices, magnetic random access memory (MRAM) devices or ferroelectric random access memory (FeRAM) devices, or a technical field for implementing a logic device in which a logic integrated circuit is integrated. Embodiments of the present disclosure may be applied to a technical field for implementing various products requiring fine patterns.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a cross-sectional view illustrating a cross-sectional shape in which a photoresist pattern 100 is formed.

Referring to FIG. 1, the photoresist pattern 100 may be formed. The photoresist pattern 100 may be formed as a pattern providing a plurality of third opening portions 110. The plurality of the third opening portions 110 may be formed in through-hole shapes having substantially the same size and shape as each other.

The photoresist pattern 100 may be formed on a buffer layer 200. The buffer layer 200 may be formed on a semiconductor substrate 500. Several layers may be further formed between the semiconductor substrate 500 and the buffer layer 200. A base layer 400 may be formed on the semiconductor substrate 500. A target layer 300 may be formed on the base layer 400 and the buffer layer 200 may be positioned on the target layer 300. The target layer 300 may be a layer to be patterned by a pattern forming method according to an embodiment, and may be a layer to be patterned by an etch mask pattern or a hard mask pattern. The base layer 400 may be a layer to be selectively etched by a hard mask pattern.

For example, the semiconductor substrate 500 may be a silicon (Si) wafer. The base layer 400 may be a polycrystalline silicon layer. The polycrystalline silicon layer may be formed in a thickness of about 600 Å. The target layer 300 may be a layer that includes a material having an etch selectivity with respect to the base layer 400. The target layer 300 may be a layer that includes a material having a lower etch rate than the base layer 400 in a process of etching the base layer 400. The target layer 300 may be a layer that includes various dielectric materials used in an etch mask pattern or a hard mask pattern. The target layer 300 may have a multilayer structure in which a plurality of material layers are stacked.

The target layer 300 may have a multilayer structure including a target body layer 310 and a target capping layer 320 formed thereon. The target body layer 310 may include a carbon layer or a spin on carbon (SOC) layer. The SOC layer may be formed by a coating process. The carbon layer may be an amorphous carbon layer formed by a deposition process. The target capping layer 320 may include a silicon oxynitride (SiON) layer covering the SOC layer. The SOC layer may be formed in a thickness of about 1,300 Å and the SiON layer may be formed in a thickness of about 400 Å.

The buffer layer 200 may be formed on the target layer 300. The buffer layer 200 may be formed in a single layer. It is effective that the buffer layer 200 is formed in a composite layer in which material layers overlap each other. The buffer layer 200 may have a multilayer structure including a buffer body layer 210 and a buffer capping layer 220 formed thereon. The buffer body layer 210 may include a carbon layer or a spin on carbon (SOC) layer. The buffer capping layer 220 may include a silicon oxynitride (SiON) layer covering the SOC layer. The SOC layer may be formed in a thickness of about 1,300 Å and the SiON layer may be formed in a thickness of about 200 Å. The buffer capping layer 220 may be formed as a bottom anti-reflection coating (BARC) for the photoresist pattern 100. The BARC may be used as an auxiliary layer in a photolithography process for forming the photoresist pattern 100.

The third opening portions 110 of the photoresist pattern 100 may be formed in hole shapes exposing portions of the surface of the buffer layer 200 at the bottom. The third opening portions 110 of the photoresist pattern 100 may be formed in hole shapes exposing portions of the surface of the SiON layer of the buffer capping layer 220 at the bottom.

Figure 2:
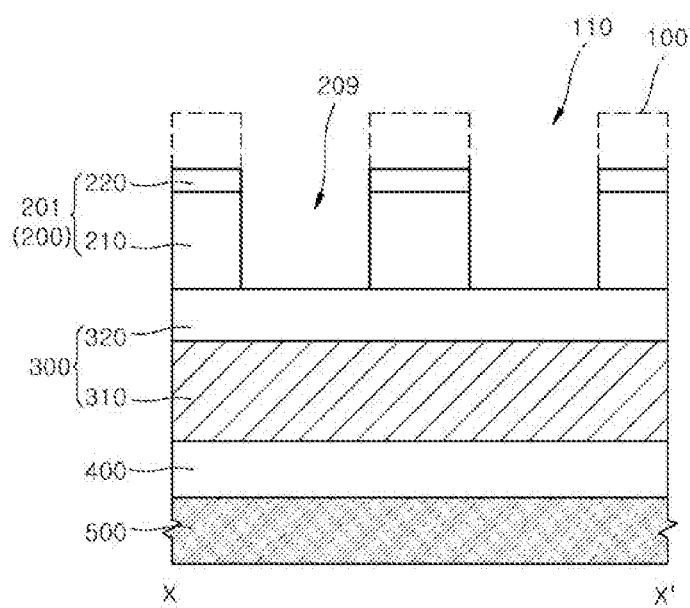

FIG. 2 is a cross-sectional view illustrating a cross-sectional shape in which a buffer layer pattern 201 is formed.

Referring to FIG. 2, portions of the buffer layer 200 exposed by the third opening portions 110 may be selectively etched and removed using the photoresist pattern 100 as an etch mask pattern. The exposed portions of the buffer layer 200 may be removed, and second opening portions 209 of the buffer layer may be formed in hole shapes substantially penetrating the buffer layer 200. The buffer layer 200 may be patterned into a buffer layer pattern 201 providing the second opening portions 209. The plurality of second opening portions 209 provided by the buffer layer pattern 201 may each have a shape substantially conforming to the shape of each of the third opening portions 110 of the photoresist pattern 100. The second opening portions 209 may be formed in hole shapes exposing portions of the surface of the target layer 300 at the bottom. The second opening portions 209 may be formed in hole shapes exposing portions of the surface of the target capping layer 320 at the bottom.

After forming the buffer layer pattern 201, the photoresist pattern 100 may be selectively removed.

Figure 3:
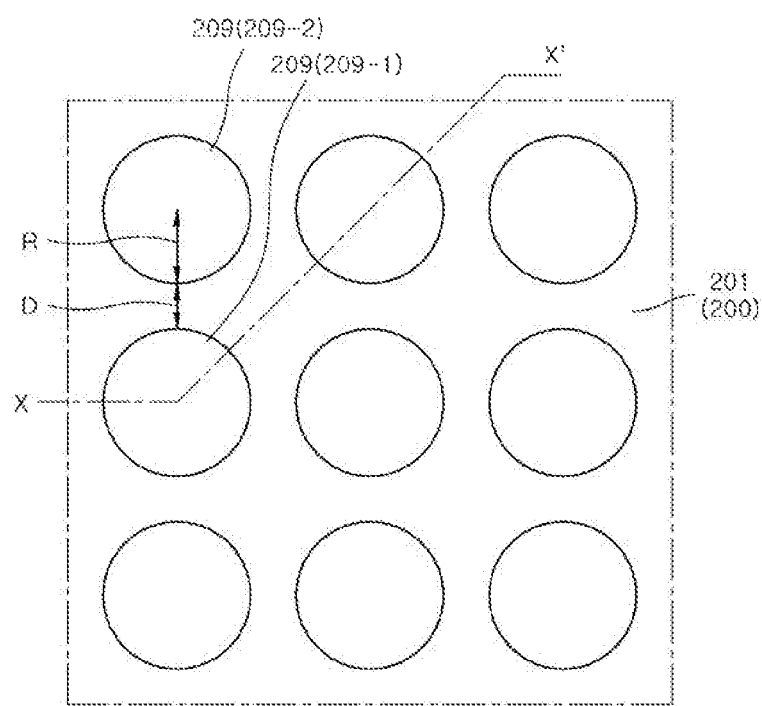
Figure 4:
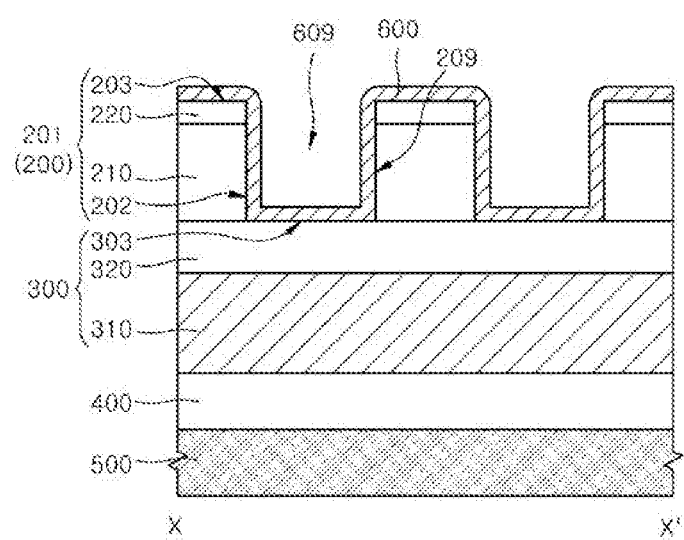

FIG. 3 is a plan view illustrating planar shapes of the second opening portions 209 of the buffer layer pattern 201. FIG. 4 is a cross-sectional view illustrating a cross-sectional shape along the cutting line X-X' of FIG. 3. FIG. 4 shows that a first spacer layer 600 is formed on the buffer layer pattern 201.

Referring to FIG. 3, the buffer layer 201 may provide arrays of a plurality of second opening portions 209. The second opening portions 209 may be arranged in a square or diamond shape in a plan view. The second opening portions 209 may be arranged to be positioned at vertices of square or diamond shape in a plan view.

The second opening portions 209 may be arranged such that a separation distance D between any one 209-1 of the second opening portions 209 and another one 209-2 is smaller than a radius R of the second opening portion 209. The second opening portion 209-1 may be formed to have a radius R greater than the separation distance D from other closest neighboring second opening portion 209-2.

FIG. 4 is a cross-sectional view illustrating a cross-sectional shape in which a first spacer layer 600 is formed on the buffer layer pattern 201.

Referring to FIG. 4, the first spacer layer 600 covering the buffer layer pattern 201 may be formed. The first spacer layer 600 may be formed to extend to cover side surfaces 202 and upper surfaces 203 of the buffer layer pattern 201 and to cover surface portions 303 of the target layer 300 exposed at the bottom of the second opening portions 209. The first spacer layer 600 may be formed to extend to cover the surface portions 303 of the target layer 300 exposed at the bottom of the second opening portions 209, which is connected to the side surfaces 202 of the buffer layer pattern 201, to provide concave first inner spaces 609.

The first spacer layer 600 may include a dielectric material layer having an etch selectivity with respect to the buffer layer pattern 201 or the buffer body layer 210. The first spacer layer 600 may include a layer of a different dielectric material from the buffer layer pattern 201 or the buffer body layer 210. The first spacer layer 600 may include a silicon oxide layer, for example, an ultra low temperature oxide (ULTO) layer having a thickness of about 200 Å. The first spacer layer 600 may include a dielectric material layer having a etch selectivity with respect to the underlying target layer 300 or the target body layer 310. The first spacer layer 600 may include a dielectric material layer having an etch selectivity with respect to an amorphous carbon layer or an SOC layer.

Figure 5:
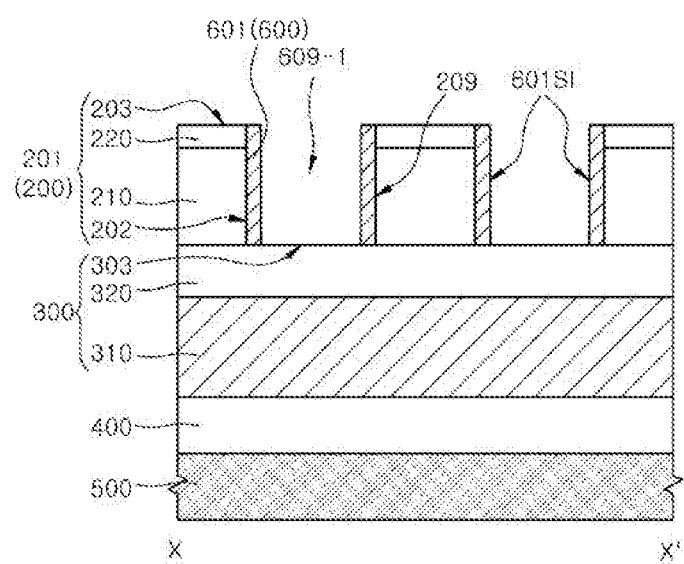
Figure 6:
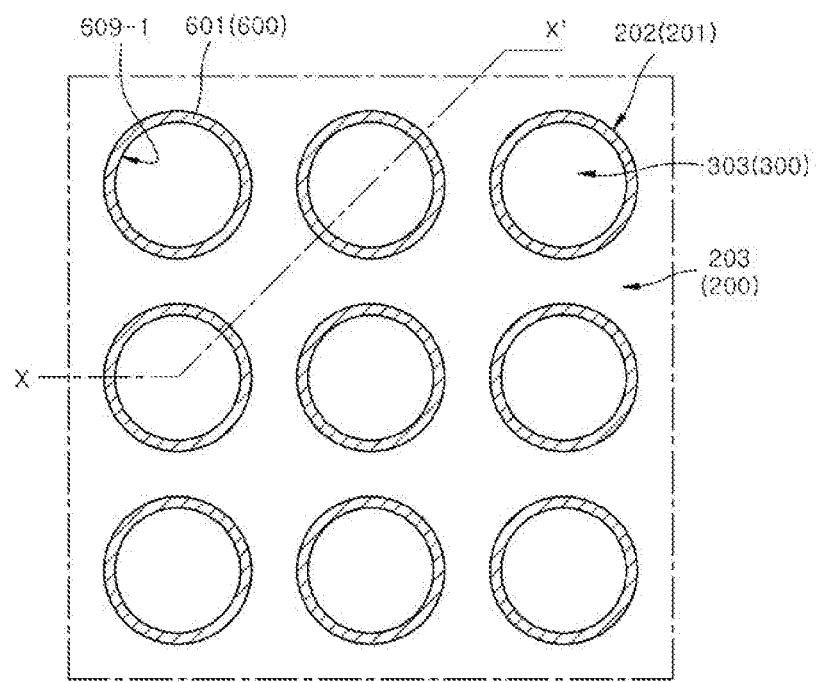

FIGS. 5 and 6 are a cross-sectional view and a plan view illustrating a cross-sectional shape and a planar shape, respectively, in which spacer layer 600 is sectioned into portions to form first spacers 601.

Referring to FIGS. 5 and 6, the first spacers 601 covering the side surfaces 202 of the buffer layer pattern 201 may be formed. The first spacer layer 600 may be spacer-etched to be remained only on the side surfaces 202 of the buffer layer pattern 201, thereby separating the portions of the first spacer layer 600 into the first spacers 601. The spacer-etching may be performed by an anisotropic etch process using a carbon fluoride ($CF_x$)-based gas. Some portions of the first spacer layer 600 covering an upper surface 203 of the buffer layer pattern 201 and another portion of the first spacer layer 600 covering the partial surface portion 303 of the target layer 300 may be removed by the spacer-etching and only another portion of the first spacer layer 600 covering the side surface 202 of the buffer layer pattern 201 may remain, thereby forming the first spacers 601. The first spacers 601 may be formed to cover the side surfaces 202 of the buffer layer pattern 201 and to expose the upper surface 203 of the buffer layer pattern 201 and some surface portions of the target layer 300.

While the first spacers 601 expose some surface portions 303 of the target layer 300, the first inner spaces 609 of FIG. 4 may extend into the first inner spaces 609-1 exposing portions of the surface portion 303 of the target layer 300 at the top. The first spacers 601 may be formed to respectively provide the extended first inner spaces 609-1 inside the first spacers 601. The first inner spaces 609-1 may be formed in the shape of through holes penetrating substantially through the structure including the buffer layer pattern 201 and the first spacer 601. The first inner spaces 609-1 may be formed in the shape of opening portions exposing some surface portions 303 of the target layer 300. The inner side surfaces 601SI of the first spacer 601 may be exposed to the first inner spaces 609-1 as side surfaces facing the first inner spaces 609-1.

Figure 7:
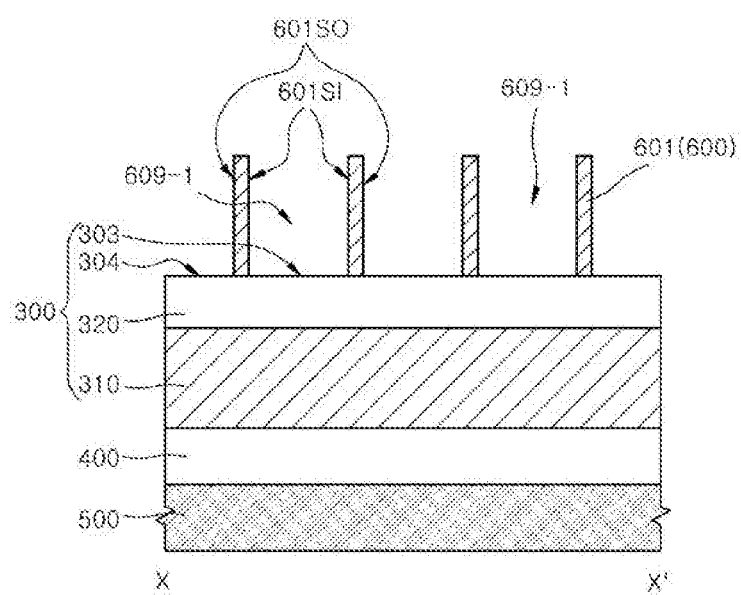
Figure 8:
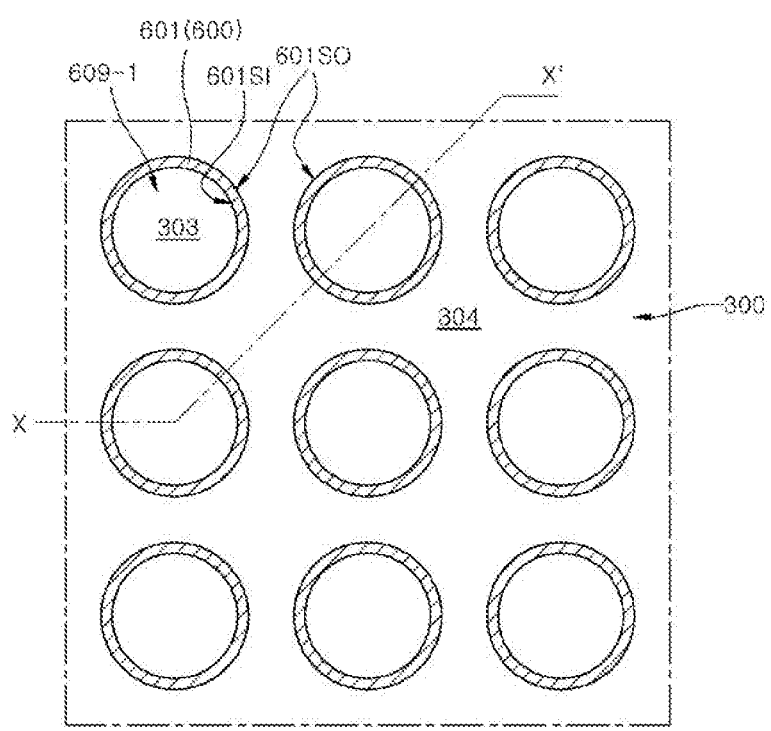

FIGS. 7 and 8 are a cross-sectional view and a plan view illustrating a cross-sectional shape and a planar shape of the first spacers 601 protruding from the target layer 300, respectively.

Referring to FIGS. 7 and 8, the buffer layer pattern (201 of FIG. 5) may be selectively removed. For Example, the buffer capping layer 200 portion of the buffer layer pattern 201 may be etched and removed, and then a plasma etching process using oxygen gas (O2) may be performed to etch away the SOC layer forming the buffer body layer 210. Accordingly, while maintaining the first inner spaces 609-1 inside the first spacers 601, some other surface portions 304 of the target layer 300 may be exposed outside the first spacers 601. The other surface portions 304 of the exposed target layer 300 may be portions where the buffer layer pattern 201 is to be removed and exposed.

The first spacers 601 may each have a cylindrical shape protruding from the target layer 300. The first inner spaces 609-1 may be positioned in a concave shape or a through hole shape inside the cylindrical shape of each of the first spacers 601. The plurality of first spacers 601 may be formed to be arranged at predetermined intervals, as shown in FIG. 8. The structures including the first spacers 601 and the first inner spacers 609-1 may be positioned to be overlapped with the second opening portions 209 (see FIG. 3) of the buffer layer 200. Inner side surfaces 601SI of the first spacers 601 may be exposed to the first inner spaces 609-1 as side surfaces facing the first inner spaces 609-1. Outer side surfaces 601SO of the first spacers 601 may be exposed on the side opposite to the inner side surfaces 601SI of the first spacers 601. The first spacers 601 may be placed on the surface of the target layer 300 so that the outer side surfaces 601SO of the first spacer 601 face each other.

Figure 9:
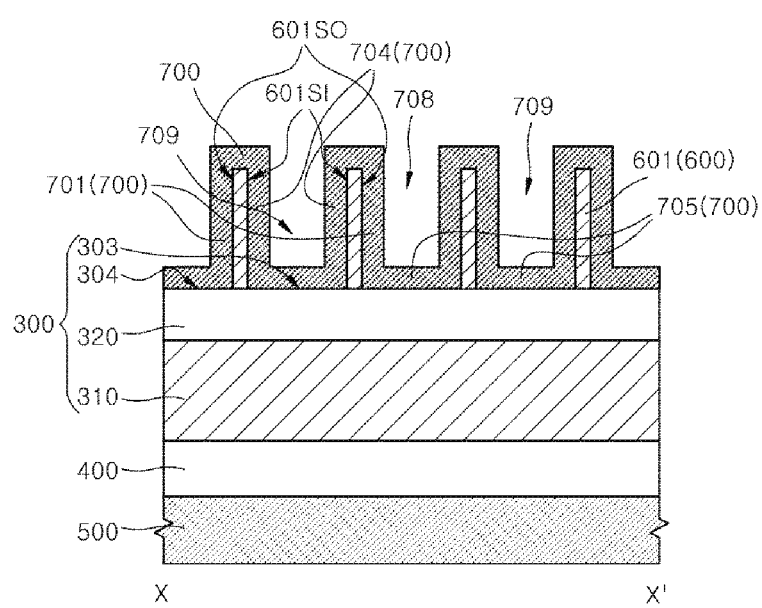
Figure 10:
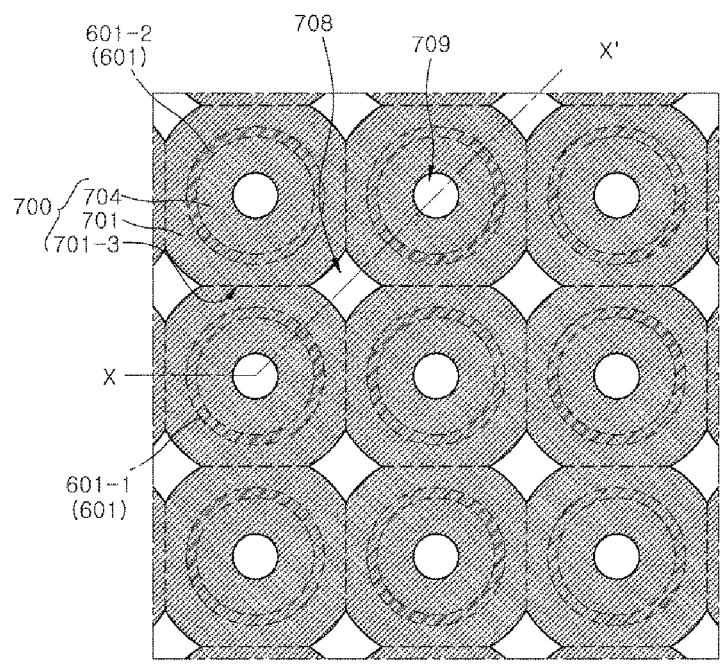

FIGS. 9 and 10 are a cross-sectional view and a plan view illustrating a cross-sectional shape and a planar shape in which second spacer layers 700 are formed to cover the side surfaces of the first spacers 601. In FIG. 10, the bottom portions 705 of the second spacer layer are not shaded in order to clearly show interstitial spaces 708 and second inner spaces 709. The bottom portions 705 of the second spacer layer are overlapped with interstitial spaces 708 and second inner spaces 709.

Referring to FIGS. 9 and 10, the second spacer layers 700 may be formed to cover the surfaces of the first spacers 601 and target layer 300. The second spacer layer 700 may be formed to extend to cover the surface portions 303 and 304 of the target layer 300, which are exposed by the first spacers 601, and cover the shapes of the first spacers 601. The second spacer layer 700 may be formed to conformally cover the shapes of the first spacers 601 along the shapes of the first spacers 601.

The second spacer layer 700 may be formed of a layer of a material substantially the same as a material forming the first spacer 601. The second spacer layer 700 may include an oxide layer such as an ultra-low temperature oxide layer.

The second spacer layer 700 may be formed to include inner side wall portions 704, outer side wall portions 701, and bottom portions 705. The bottom portions 705 of the second spacer layer 700 may be portions which cover the surface portions 303 and 304 of the target layer 300 outside the first spacers 601. The inner side wall portions 704 of the second spacer layer 700 may be portions which cover the inner side surfaces 601SI of the first spacers 601. The inner side wall portions 704 of the second spacer layer 700 may be formed to provide second inner spaces 709 therebetween. The second inner spaces 709 provided by the second spacer layer 700 may be provided to be positioned at a position overlapped with the first inner spaces (609-1 of FIG. 7). The second inner spaces 709 provided by the second spacer layer 700 may be concave spaces formed inside the first spacers 601.

The outer side wall portions 701 of the second spacer layer 700 may be portions which cover the outer side surfaces 601SO of the first spacers 601. The outer side wall portions 701 of the second spacer layer 700 may extend to surround all of the outer side surfaces 601SO of the first spacers 601. The outer side wall portions 701 of the second spacer layer 700 may be formed to provide interstitial spaces 708 between the first spacers 601, as illustrated in FIG. 10. The interstitial spaces 708 may be formed to be positioned at the center portion of four neighboring first spacers 601 when viewed in a plan view.

The outer side wall portions 701 of the second spacer layer 700 may extend in a horizontal direction such that the interstitial spaces 708 are disposed in each of the center portions of four neighboring first spacers 601. The interstitial spaces 708 may be formed at substantially the same intervals from four first spacers 601 disposed closest to each other around each of the interstitial spaces 708. Accordingly, the interstitial spaces 708 may be formed at a position where each of the interstitial spaces 708 is evenly spaced from four second inner spaces 709 that are closest to each other.

The interstitial spaces 708 may be concave spaces provided by the side surfaces of the outer side wall portions 701 of the second spacer layer 700 and the bottom portions 705 of the second spacer layer 700. The interstitial spaces 708 may be induced in a process of forming the second spacer layer 700 by a structural environment of a structure in which the first spacers 601 are formed.

Figure 11:
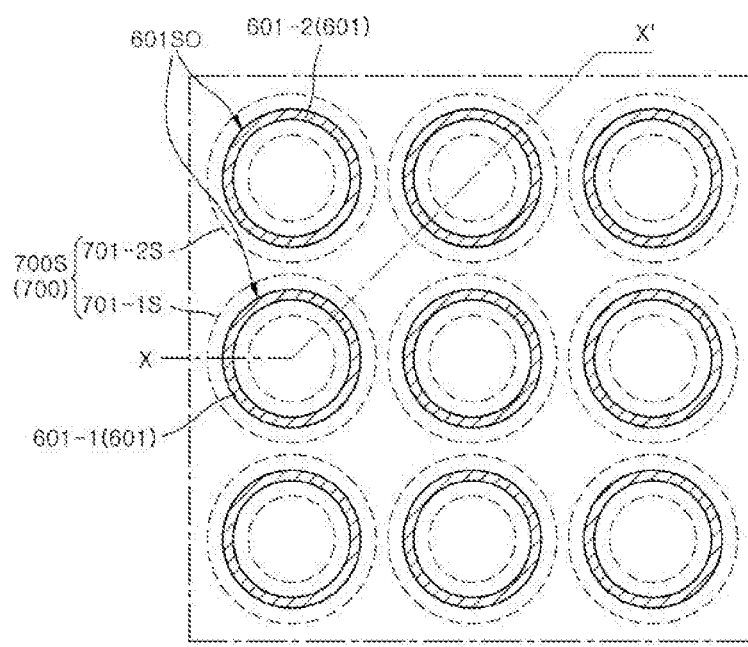
Figure 12:
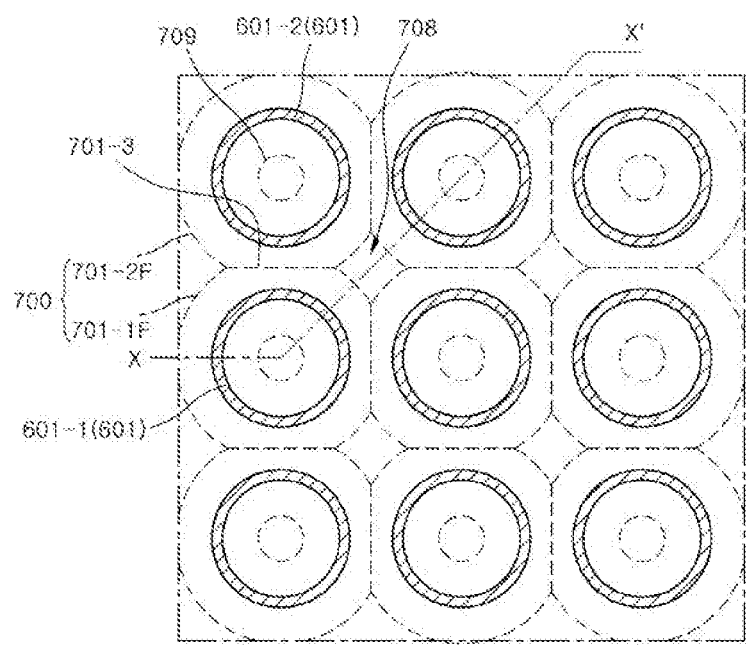

FIGS. 11 and 12 are plan views illustrating detailed sub-processing steps to forme the second spacer layer 700 of FIGS. 9 and 10.

Referring to FIG. 11, when the second spacer layer 700 is formed on a structure in which the first spacers 601 are formed on the target layer 300, at the beginning of the deposition process of forming the second spacer layer 700, an initial second spacer layer 700S is formed to have a thickness thinner than that of the final second spacer layer 700. As the process of depositing the second spacer layer 700 proceeds, the initial outer side wall portions 701-1S and 701-2S of the initial second spacer layer 700S grow horizontally outward from the outer side surfaces 601SO of the first spacers 601 (i.e., first spacer and second spacer 601-1 and 601-2. In some embodiments, the first spacer 601-1 may be referred to as a first individual spacer and the second spacer 601-2 may be referred to as a second individual spacer.

The initial first outer side wall portions 701-1S of the initial second spacer layer 700S may be formed to surround the outer side surfaces 601SO of the first spacers 601-1 and the initial second outer side wall portions 701-2S of the initial second spacer layer 700A may be formed to surround the outer side surfaces 601SO of the second spacers 601-2. The first spacer 601-1 and the second spacer 601-2 may be two spacers 601 that are closest and neighbor to each other. The initial first outer sidewall portions 701-1S and the initial second outer sidewall portions 701-2S of the initial second spacer layer 700S may be formed to face each other laterally at a predetermined interval.

Referring to FIGS. 12 and 11, as the process of depositing the second spacer layer 700 proceeds further, the initial first outer sidewall portions 701-1S and the initial second outer sidewall portions 701-1S of the initial second spacer layer 700S may grow laterally closer to each other gradually. In accordance with this, the grown first outer sidewall portions 701-1F may abut and contact the grown second outer sidewall portions 701-2F, and the first outer sidewall portions 701-1F and the second outer sidewall portions 701-2F may form boundary surfaces 701-3 and contact each other. If the deposition process is further performed while the first outer sidewall portions 701-1F and the second outer sidewall portions 701-2F abut, the boundary surfaces 701-3 may be further extended. The interstitial spaces 708 may be formed at the points where these boundary surfaces 701-3 converge. The process of depositing the second spacer layer 700 may be terminated while the interstitial spaces 708 maintain constant sizes.

Referring to FIGS. 12 and 10, the second spacer layer 700 may be formed to provide second inner spaces 709 and the interstitial spaces 708. The second inner spaces 709 may be positioned in the first spacers 601, and the interstitial spaces 708 may be positioned in intermediate portions between the first spacers 601. In this case, the interstitial spaces 708 may be disposed to be equally spaced from the surrounding first spacers 601. In some cases, the number of the first spacers positioned around the interstitial spaces may vary, but at least three or more first spacers should be arranged at equal intervals around the interstitial space in order for the second spacer layer to induce the interstitial spaces.

Figure 13:
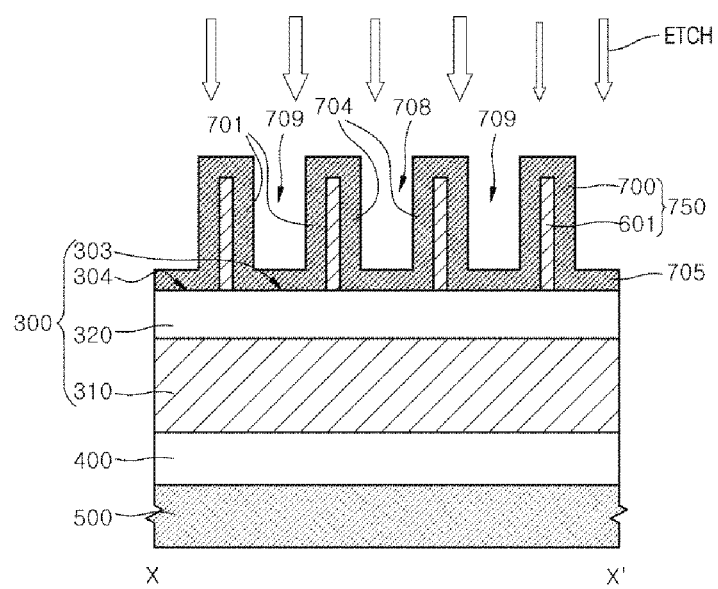

FIG. 13 is a cross-sectional view illustrating an etching process using an etch mask 750 including the first spacers 601 and the second spacer layer 700.

Referring to FIG. 13, the resultant structure including the first spacers 601 and the second spacer layer 700 may provide the etch mask 750 for patterning the underlying target layer 300. An etching process may be performed on the resultant structure in which the etch mask 750 is formed. The etching process may be performed by an anisotropic plasma etching process. The inner sidewall portions 704 and outer sidewall portions 701 of the second spacer layer 700 and the first spacers 601, which form the etch mask 750, may provide etch masking portions that prevent etching.

The inner sidewall portions 704 and outer sidewall portions 701 of the second spacer layer 700, and the target layer 300 portion overlapping the first spacer 601 may be portions shielded by the inner sidewall portions 704 and outer sidewall portions 701 of the second spacer layer 700 and the first spacers 601 to be protected from etching during the etching process. On the other hand, the bottom portions 705 of the second spacer layer 700 of the etch mask 750 is removed during the etching process, so that other portions of the target layer 300 overlapping the bottom portions 705 of the second spacer layer 700 of the etch mask 750 may be portions to be removed and exposed to the etching during the etching process. Other portions of the target layer 300 overlapping the bottom portions 705 of the second spacer layer 700 of the etch mask 750 may be etched and removed.

Figure 14:
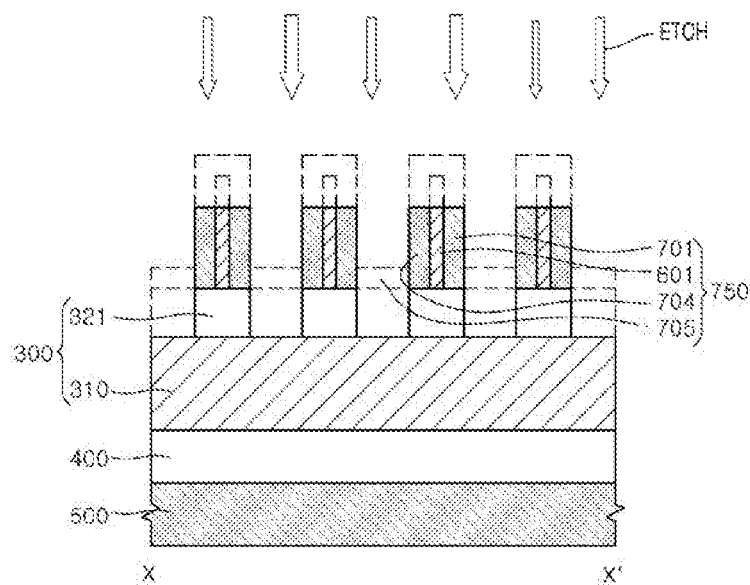

FIG. 14 is a cross-sectional view illustrating a process of patterning the target capping layer pattern 321 using the etch mask 750.

Referring to FIGS. 14 and 13, as the etching process for the etch mask 750 proceeds, the bottom portions 705 of the second spacer layer 700 of the etch mask 750 may be removed. The bottom portions 705 of the second spacer layer 700 may be relatively thinner than the inner sidewall portions 704 and outer sidewall portions 701 of the second spacer layer 700 and the first spacers 601. Accordingly, the bottom portions 705 of the second spacer layer 700 may be firstly removed by the etching process performed with respect to the second spacer layer 700 even when the inner sidewall portions 704 and outer sidewall portions 701 of the second spacer layer 700 and the first spacers 601 remain.

As the bottom portion 705 of the second spacer layer 700 is first removed, the remaining inner sidewall portions 704 and outer sidewall portions 701 of the second spacer layer 700 and the first spacer 601 portions may constitute the substantial etch mask 750. The etch mask 750 formed as described above may expose some parts of the target layer 300 overlapping the bottom portions 705 of the second spacer layer 700. The etch mask 750 may expose some parts of the target capping layer 320 overlapping the bottom portions 705 of the second spacer layer 700. Some portions of the target capping layer 320 exposed by the etch mask 750 may be exposed to etching by a further etching process. Some portions of the target capping layer 320 exposed by the etch mask 750 may be selectively etched and removed, so that the portions of the target capping layer 320 overlapping the etch mask 750 may be patterned into a target capping layer pattern 321.

Figure 15:
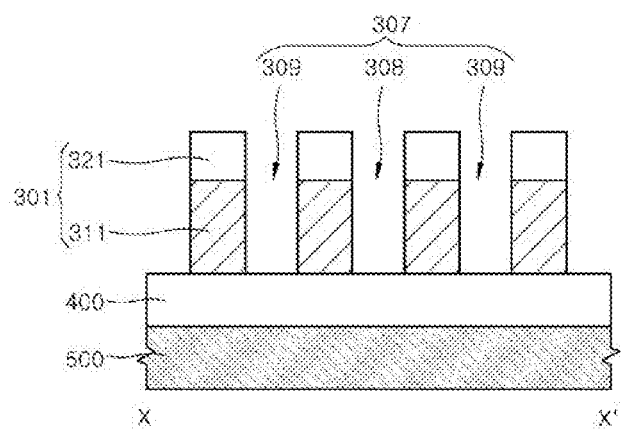

FIG. 15 is a cross-sectional view illustrating the step of forming the target body layer pattern 311.

Referring to FIGS. 15 and 14 together, an etching process using the etch mask 750 may be further performed to selectively etch and remove portions of the target body layer 310 exposed by the target capping layer pattern 321. Portions of the target body layer 310 overlapped by the etch mask 750 and target capping layer pattern 321 may be patterned into the target body layer pattern 311. A target layer pattern 301 including the target body layer pattern 311 and the target capping layer pattern 321 may be formed. Thereafter, the etching mask 750 may be selectively removed.

Figure 16:
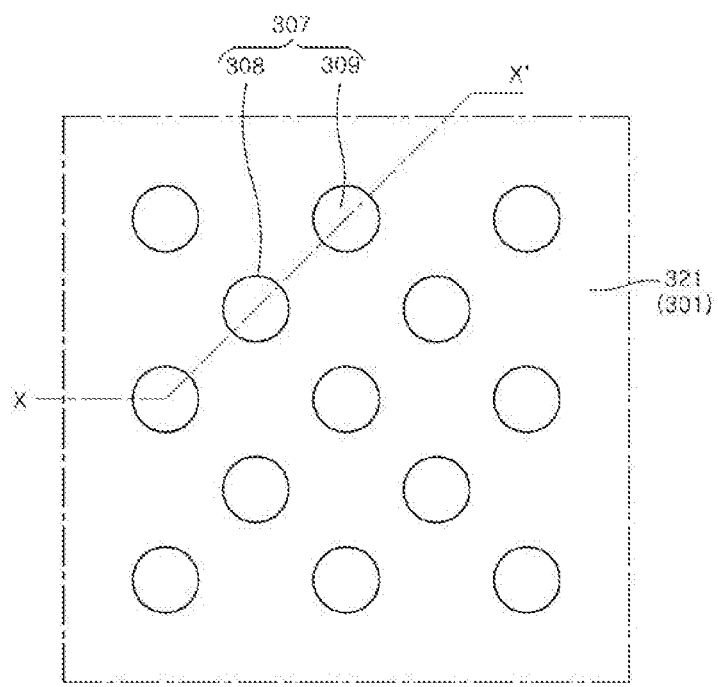

FIG. 16 is a plan view illustrating a planar shape of first opening portions 307 formed in the target layer pattern 301.

Referring to FIGS. 16 and 15 together, the target layer pattern 301 may be patterned as a pattern providing the first opening portions 307. The first opening portions 307 may have a through hole shape or contact hole shape substantially penetrating the target layer 300 (300 of FIG. 9). The first opening portions 307 may be arranged in a very dense arrangement as illustrated in FIG. 16.

The first opening portions 307 may have a size or a diameter smaller than the size or diameter that can be formed by a photolithography process. Accordingly, the first opening portions 307 may be formed to have a diameter smaller than the size limit that can be formed in one photolithography process. If the third opening portion 110 of the photoresist pattern 100 illustrated in FIG. 1 has a limit size than can be formed in a photolithography process, each of the first opening portions 307 may be formed to have a size smaller than that of the third opening portion 110. The first opening portions 307 may be arranged at least twice as dense as the third opening portion 110. The first opening portions 307 may be arranged at least twice as dense as the second opening portions (209 of FIG. 3). The first opening portions 307 may consist of first opening portions 309 of a first group and first opening portions 308 of a second group. The first opening portions 309 of the first group may be formed in through hole shapes extending from the second inner spaces (709 of FIG. 9) provided by the second spacer layer (700 of FIG. 9). The first opening portions 309 of the first group may be positioned at positions overlapping the second inner spaces 709 provided by the second spacer layer 700. The first opening portions 308 of the second group may be formed in through hole shapes extending from the interstitial spaces (708 of FIG. 9) provided by the second spacer layer 700. The first opening portions 308 of the second group may be positioned at positions overlapping the interstitial spaces (708 of FIG. 9) provided by the second spacer layer 700.

Figure 17:
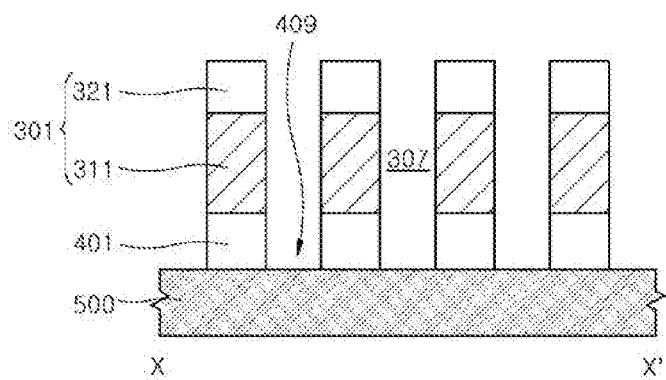

FIG. 17 is a cross-sectional view illustrating a step of forming the base layer pattern 401.

Referring to FIG. 17, a pattern forming method according to an embodiment may be applied to a process of forming fourth opening portions 409 substantially penetrating the base layer (400 of FIG. 15) in the base layer 400. For example, another etching process using the target layer pattern (301 of FIG. 15) as another etch mask or hard mask may be further performed. The exposed portions of the base layer 400 exposed by the target layer pattern 301 may be selectively etched and removed so that the fourth opening portions 409 may be formed in the base layer 400. The base layer pattern 401 providing the fourth opening portions 409 may be formed. The fourth opening portions 409 may have through-hole shapes in which the first opening portions (307 of FIGS. 15 and 16) of the target layer pattern 301 extend.

The above-described pattern forming method may include forming the target layer (300 of FIG. 1) on the semiconductor substrate (500 of FIG. 1) and forming a plurality of first spacers (601 of FIG. 7) having cylindrical shapes protruding onto the target layer 300. The pattern forming method may include forming the second spacer layer (700 of FIG. 10)

that is formed to cover the first spacers 601, to provide the interstitial spaces (708 of FIG. 10) between the first spacers 601, and to provide the second inner spaces (709 of FIG. 10) to the first inner spaces (609-1 of FIG. 7) of the first spacers 601, respectively. The pattern forming method may include etching the second spacer layer to form the first opening portions (307 of FIG. 15) in which the second inner spaces and the interstitial spaces extend into the target layer.

As illustrated in FIG. 10, the second spacer layer (700 of FIG. 10) may be formed to fill a spaced gap portion between at least two first spacers closest to each other among the first spacers 601. The second spacer layer 700 may be formed to provide an interstitial space 708 between a portion filling the spaced gap portion between at least two closest first spacers and another portion. The interstitial spaces 708 formed at positions equidistant from at least four first spacers adjacent to each other among the first spacers 601 may be removed. The interstitial spaces 708 may be formed to maintain equal spacing with the second inner spaces 709 disposed closest to each other around each of the interstitial spaces 708.

As illustrated in FIG. 12, the second spacer layer 700 may grow in a horizontal direction from the inner side surfaces of the first spacers 601 such that each of the second inner spaces 709 follows the shape of the first inner space and has a size smaller than the size of the first inner space. The second spacer layer 700 may be formed to grow in an opposite direction from the outer side surfaces (601SO of FIG. 9) of the first spacers while growing in a horizontal direction from the inner side surfaces of the first spacers.

Referring back to FIGS. 15 and 16, the target layer pattern 301 providing the first opening portions 307 may be applied to a cutting process that cuts the middle of the line patterns, so that the target layer pattern 301 may be used as an etch mask or a hard mask for the selective etching process. The cutting process may refer to a selective etching process that selectively removes some middle portions of the line patterns to separate a plurality of isolation patterns from one line pattern.

Figure 18:
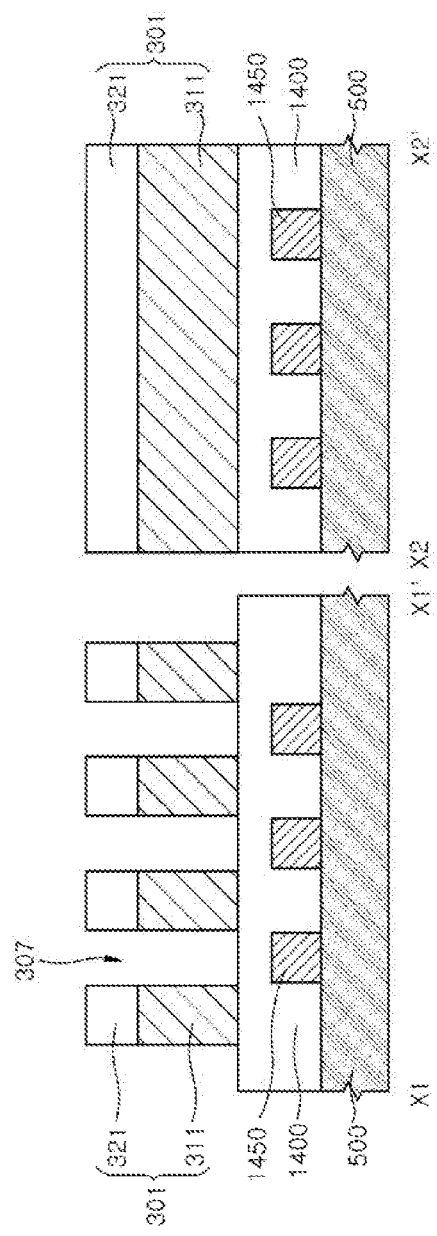
FIGS. 18 to 22 are schematic views illustrating a method of forming patterns according to another embodiment of the present disclosure.
Figure 19:
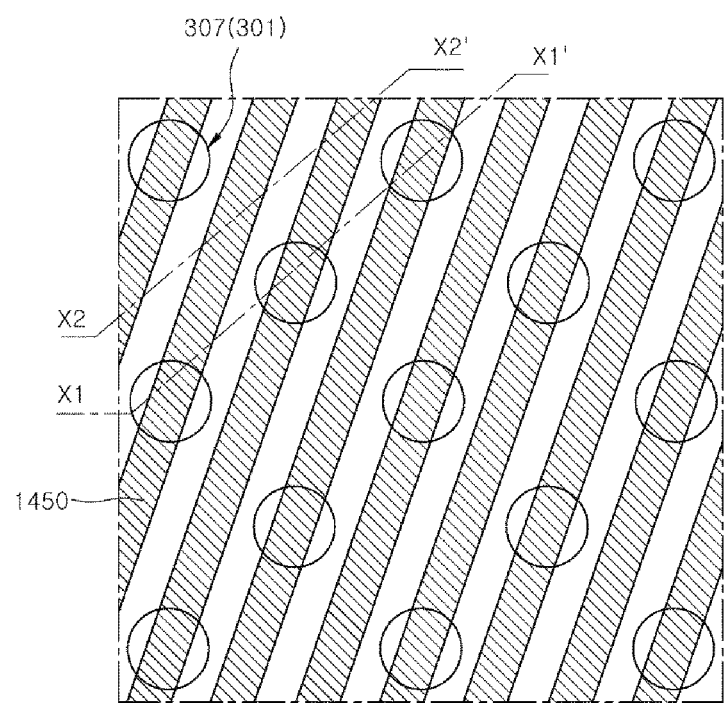
Figure 20:
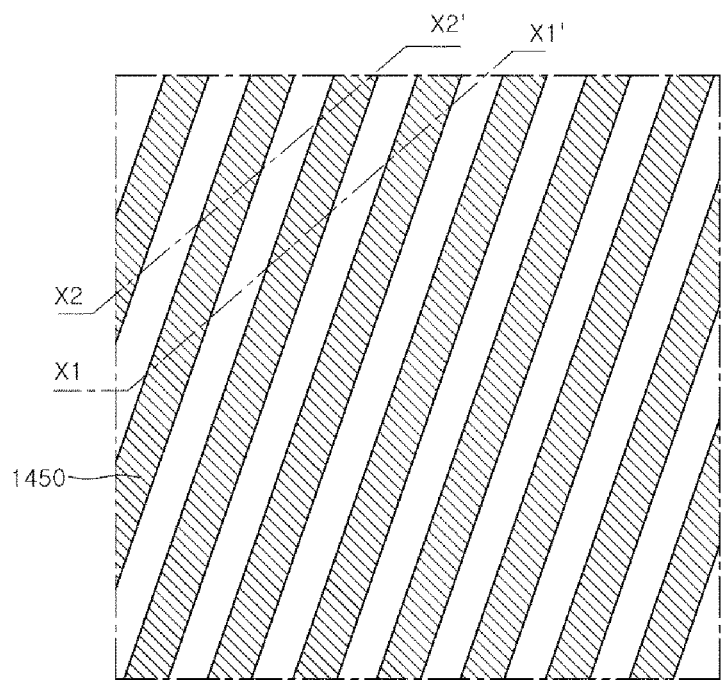

FIGS. 18 and 19 are a schematic cross-sectional view illustrating a cross-sectional shape and a schematic plan view illustrating a planar shape, respectively, in which the first opening portions 307 of the target layer pattern 301 overlap with line patterns 1450. FIG. 18 shows a cross-sectional shape along the cutting line X1-X1' and cutting line X2-X2' of FIG. 19. FIG. 20 is a schematic plan view illustrating arrays of the line patterns 1450.

Referring to FIGS. 18 and 19, the target layer pattern 301 may be introduced on the arrays of the line patterns 1450. The target layer pattern 301 may be introduced to overlap the arrays of the line patterns 1450 such that the first opening portions 307 of the target layer pattern 301 are positioned to overlap the middle portions of the line patterns 1450. The target layer pattern 301 may be formed by the pattern forming method described above with reference to FIGS. 1 to 17. The target layer pattern 301 may be formed to provide the arrays of the first opening portions 307.

Referring to FIG. 20 with FIG. 18, the line patterns 1450 may be formed on a semiconductor substrate 500 to be spaced apart from each other by a predetermined interval. The line patterns 1450 may each be formed in a bar shape extending with a predetermined line width along an oblique direction. The line patterns 1450 may be formed of a dielectric material layer such as a silicon oxide layer or a silicon nitride layer. A base layer 1400 may be formed to cover the line patterns 1450. The base layer 1400 may be formed of substantially the same layer as the base layer 400 of FIG. 1. The base layer 1400 may be formed to fill spaces between the line patterns 1450.

Figure 21:
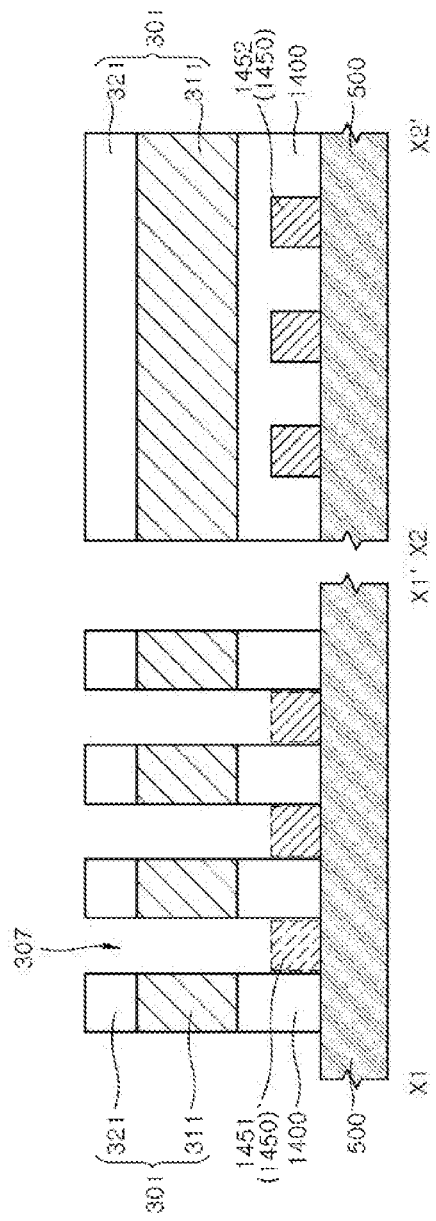
Figure 22:
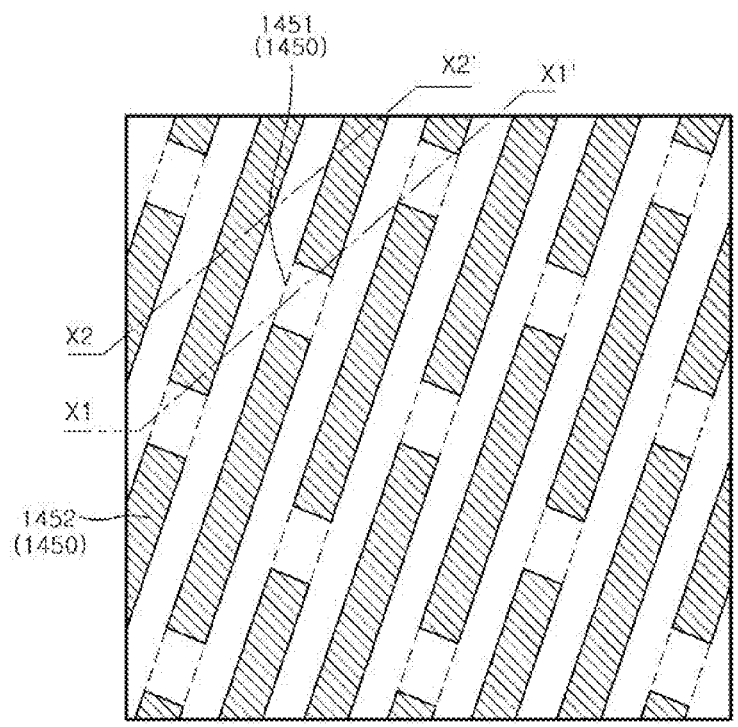

FIGS. 21 and 22 are a schematic cross-sectional view illustrating a cross-sectional shape and a schematic plan view illustrating a planar shape, respectively, in which the target layer pattern 301 is introduced on the arrays of the line patterns 1450.

Referring to FIGS. 21 and 22, exposed portions 1451 of the line patterns 1450, which are exposed by the target layer pattern 301 may be selectively etched and removed using the target layer pattern 301 as an etch mask. As the exposed portions 1451 of the line patterns 1450 are selectively removed, each of the line patterns 1450 may be separated into a plurality of isolated patterns 1450. The exposed portions 1451 of the line pattern 1450 may be removed and the line patterns 1450 may be broken into a plurality of portions to provide the plurality of the isolation patterns 1452. The separated isolation patterns 1452 may be patterned into patterns respectively overlapping active regions to be set in the semiconductor substrate 500. The regions outside the isolation patterns 1452 of the semiconductor substrate 500, which are not overlapped with the separated isolation patterns 1452, may be device isolation regions that set active regions. The separated isolation patterns 1452 may be formed in patterns that divide and set the device isolation regions of the semiconductor substrate 500. Thereafter, portions of the semiconductor substrate 500, which are exposed by the isolation patterns 1452, may be partially removed using the separated isolation patterns 1452 as an etch mask to form device isolation trenches.

As such, the target layer pattern 301 patterned by the exemplary pattern forming method may be applied as an etch mask or a hard mask in an etching process of separating the line patterns 1450 into a plurality of isolation patterns 1452. The target layer pattern 301 may be introduced as a cutting mask for cutting the line patterns 1450 in the etching process of separating into the isolation patterns 1452.

The above-described pattern forming method may include forming arrays of the line patterns (1450 of FIG. 18) on the semiconductor substrate (500 of FIG. 18) and forming the base layer (1400 of FIG. 18) covering the line patterns. The target layer (300 of FIG. 9) may be formed on the base layer, and a plurality of first spacers (601 of FIG. 9) each having a cylindrical shape protruding onto the target layer may be formed. A second spacer layer (700 of FIG. 9) may be formed to cover the first spacers, provide interstitial spaces (708 of FIG. 10) between the first spacers, and provide second inner spaces (709 of FIG. 10) to the first inner spaces (609-1 of FIG. 7) of the first spacers, respectively. An etching process may be performed with respect to the second spacer layer (700 of FIG. 13) to form first opening portions (307 of FIG. 21) in which the second inner spaces (609-1 of FIG. 21) and the interstitial spaces (708 of FIG. 10) extend in the target layer to pattern the target layer pattern (301 of FIG. 21). The first opening portions 307 may be pattern-transferred into the base layer 1400 and the line patterns 1450 using the target layer pattern (301 of FIG. 21) as an etch mask. Pattern-transferring the first opening portions 307 may extend the first opening portions such that the first opening portions selectively remove some portions of the line patterns to separate the isolation patterns (1452 of FIGS. 21 and 22) spaced apart from the line patterns.

The example of the pattern forming method may be applied to a process of forming the target layer pattern 301 and the spaced peripheral patterns together. The peripheral patterns may be patterns having shapes different from those of the first opening portions provided by the target layer pattern 301. The peripheral patterns and the target layer pattern may be formed together such that the first opening portions 307 is disposed in, for example, a cell region of the semiconductor substrate 500 and the peripheral pattern is disposed in the peripheral circuit region adjacent to the cell region. The cell region may refer to a region in which memory cell devices are arranged, and the peripheral circuit region may refer to a region in which circuits for operating the memory cell devices are arranged.

Figure 23:
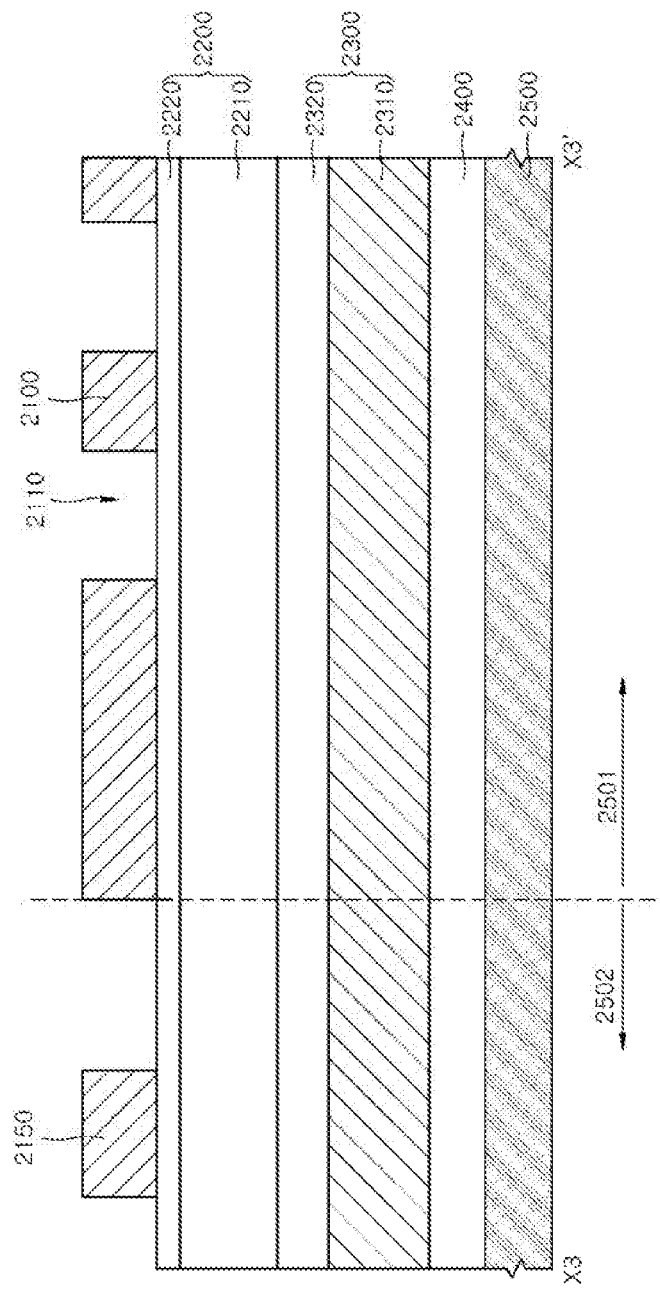
FIGS. 23 to 32 are schematic views illustrating a method of forming patterns according to yet another embodiment of the present disclosure.

FIG. 23 is a schematic cross-sectional view illustrating a cross-sectional shape in which first and second photoresist patterns 2100 and 2150 are formed.

Referring to FIG. 23, the first and second photoresist patterns 2100 and 2150 may be formed. The first photoresist pattern 2100 may be formed as a pattern providing a plurality of third opening portions 2110 like the photoresist pattern 100 of FIG. 1. Each of the third opening portions 2110 may be formed in a shape of a pattern to provide the second opening portion 209 of FIG. 3. The first photoresist pattern 2100 may be formed on a first region 2501 of a semiconductor substrate 2500. The first region 2501 of the semiconductor substrate 2500 may be a cell region.

The second photoresist pattern 2150 may be formed in a second region 2501 of the semiconductor substrate 2500. The second region 2502 of the semiconductor substrate 2500 may be a peripheral circuit region. The second photoresist pattern 2150 may be a pattern for various types of peripheral patterns that may be required in the peripheral circuit region. The first photoresist pattern 2100 may be a pattern for providing the third opening portions 2110 and the second photoresist pattern 2150 may be a pattern for providing peripheral patterns having shapes different from those of the second opening portions 2110.

The second photoresist pattern 2150 may be formed together with the photoresist pattern 2100. The second photoresist pattern 2150 and the first photoresist pattern 2100 may be patterns separated from the same photoresist layer. The second photoresist pattern 2150 and the first photoresist pattern 2100 may be formed by a photolithography process of forming a photoresist, exposing and developing the photoresist layer.

A layer stack of a base layer 2400, a target layer 2300 and a buffer layer 220 may be formed between the semiconductor substrate 2500 and the first and second photoresist patterns 2100 and 2150. The layer stack of the base layer 2400, the target layer 2300 and the buffer layer 220 may be formed in a layer stack substantially the same as or similar to the layer stack of the base layer 400, the target layer 300 and the buffer layer 200 illustrated in FIG. 1. The layer stack of the base layer 2400, the target layer 2300 and the buffer layer 220 may be formed by applying the layer stack of the base layer 400, the target layer 300 and the buffer layer 200 illustrated in FIG. 1. The target layer 2300 may be formed as a layer including a target body layer 2310 and a target capping layer 2320. The buffer layer 2200 may be formed as a layer including a buffer body layer 2210 and a buffer capping layer 2220. In addition, line patterns 1400 as shown in FIGS. 18 and 20 may be further formed between the base layer 2400 and the semiconductor substrate 2500.

Figure 24:
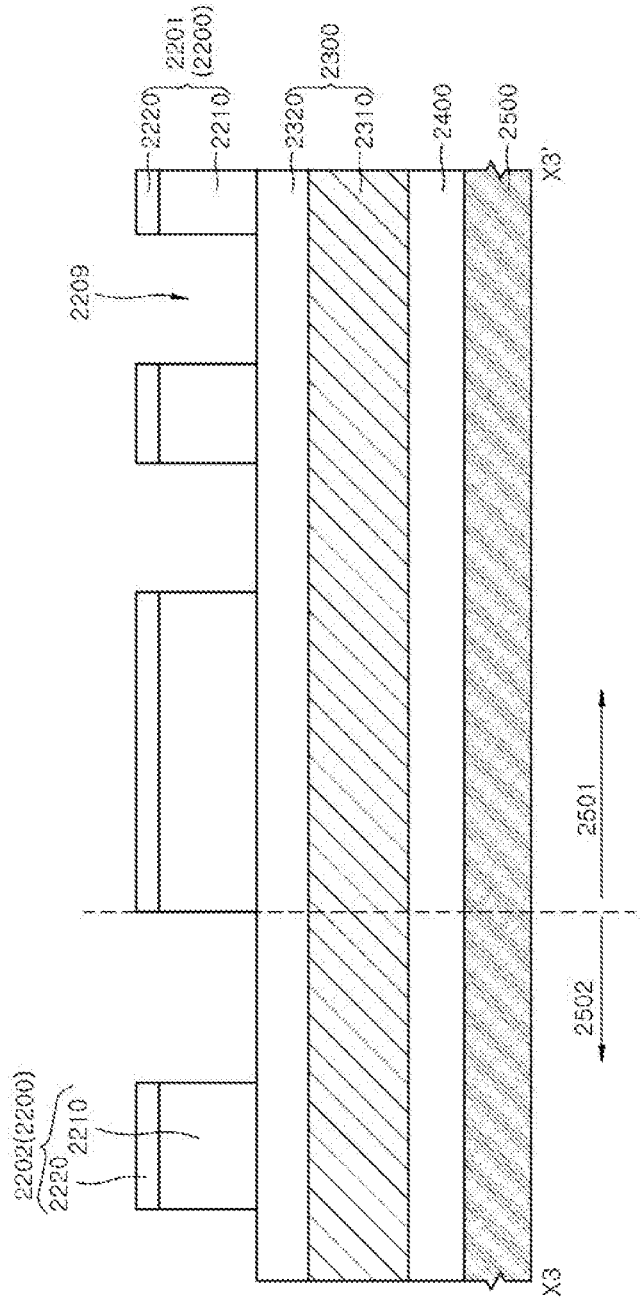
Figure 25:
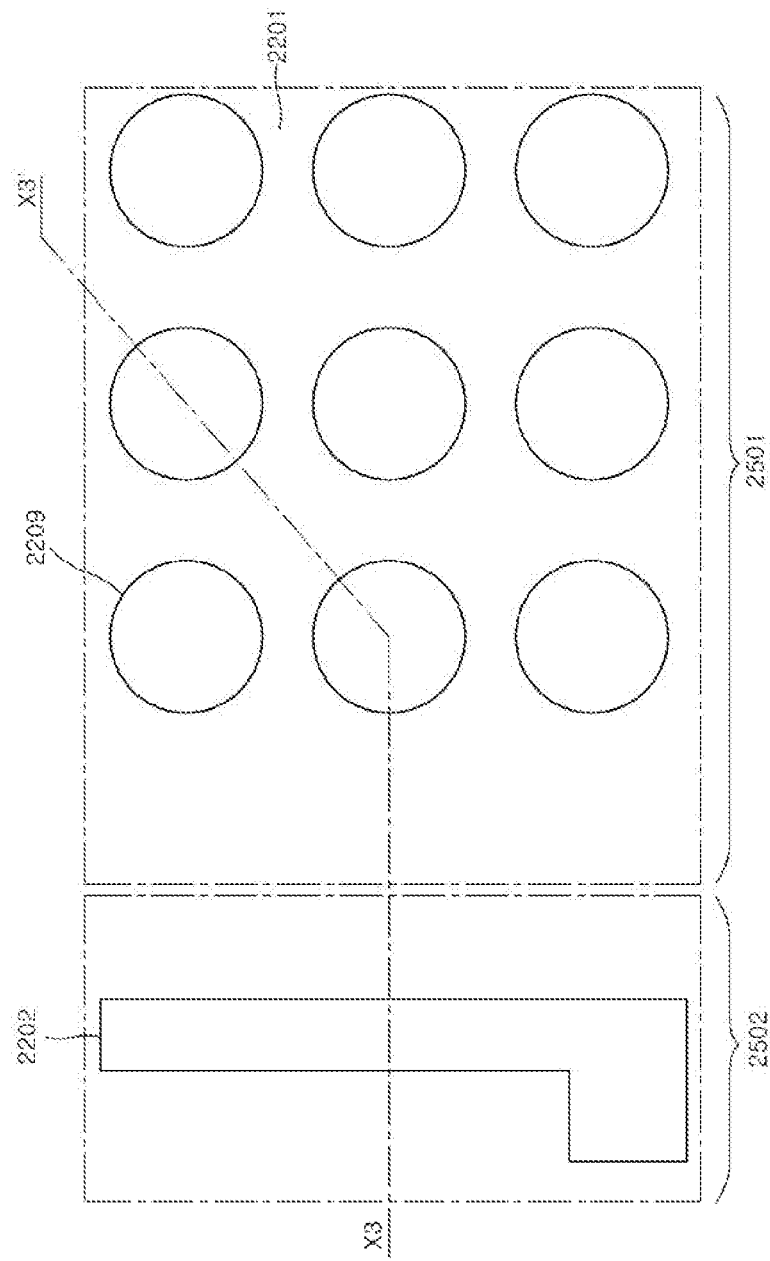

FIG. 24 is a schematic cross-sectional view illustrating a cross-sectional shape in which first and second buffer layer patterns 2201 and 2202 are formed. FIG. 25 is a schematic plan view illustrating planar shapes of the first and second buffer layer patterns 2201 and 2202. FIG. 25 is a schematic cross-sectional view illustrating a cross-sectional shape along the cutting line X3-X3' of FIG. 24.

Referring to FIGS. 24 and 25, buffer layer 2200 portion exposed by the first and second photoresist patterns 2100 and 2150 may be selectively etched and removed using the first and second photoresist patterns 2100 and 2150 as etching masks. In accordance with this, the first buffer layer pattern 2201 may be formed in the first region 2501 of the semiconductor substrate 2500 to provide the second opening portions 2209 extending from the third opening portions 2100. A second buffer layer pattern 2202 into which the pattern shape of the second photoresist pattern 2150 is transferred may be formed in the second region 2502 of the semiconductor substrate 2500. The second buffer layer pattern 2202 may be formed as a pattern spaced apart from the first buffer layer pattern 2201 by a predetermined interval. The second buffer layer pattern 2202 may be patterned in a pattern of a different shape from the second opening portions 2209, for example, of a rectangular shape or a polygonal shape.

Figure 26:
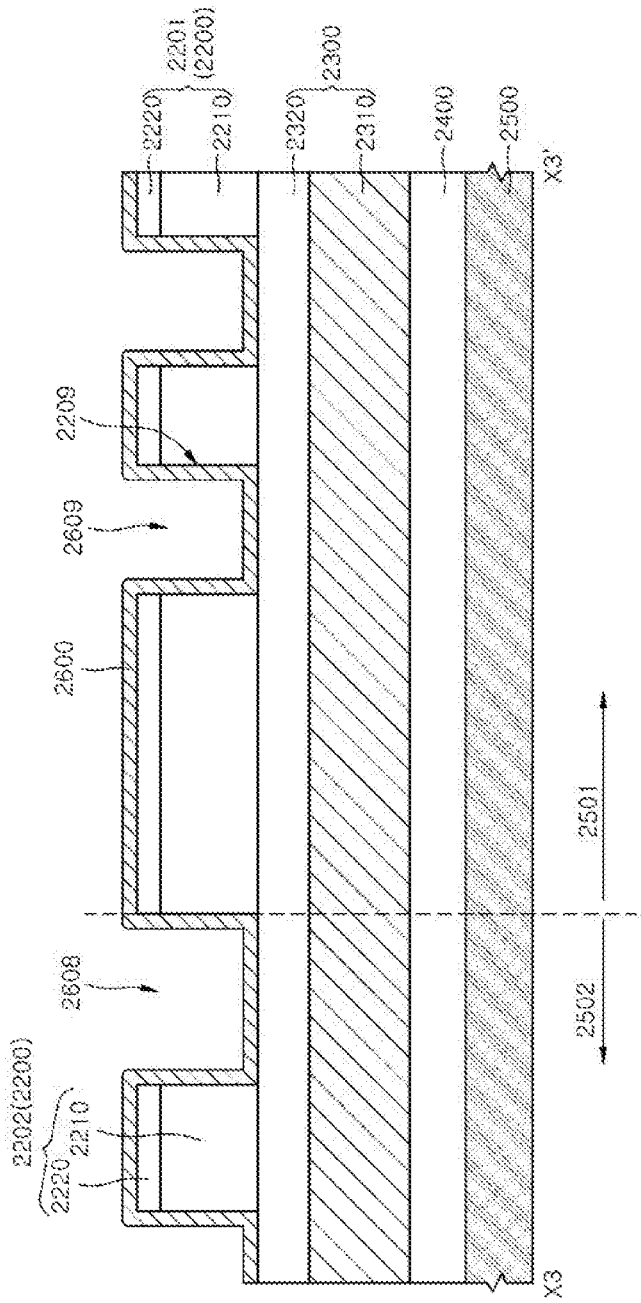

FIG. 26 is a schematic cross-sectional view illustrating a cross-sectional shape in which a first spacer layer 2600 is formed in the first and second buffer layer patterns 2201 and 2202.

Referring to FIG. 26, the first spacer layer 2600 may be formed to cover the first and second buffer layer patterns 2201 and 2202. The first spacer layer 2600 may be formed in a process substantially the same as or similar to a process of forming the first spacer 600 of FIG. 4. The first spacer layer 2600 may be formed to cover the first buffer layer pattern 2201 and may extend, so that first inner spaces 2609 are formed in shapes that follow the shapes of the second opening portions 2209.

The first spacer layer 2600 may extend to cover the second buffer layer pattern 2202. As the first spacer layer 2600 extends to cover the second buffer layer pattern 2202 and the first buffer layer pattern 2201, the first spacer layer 2600 may extend while inducing a concave interspace 2608 in a space between the second buffer layer pattern 2202 and the first buffer layer pattern 2201.

Figure 27:
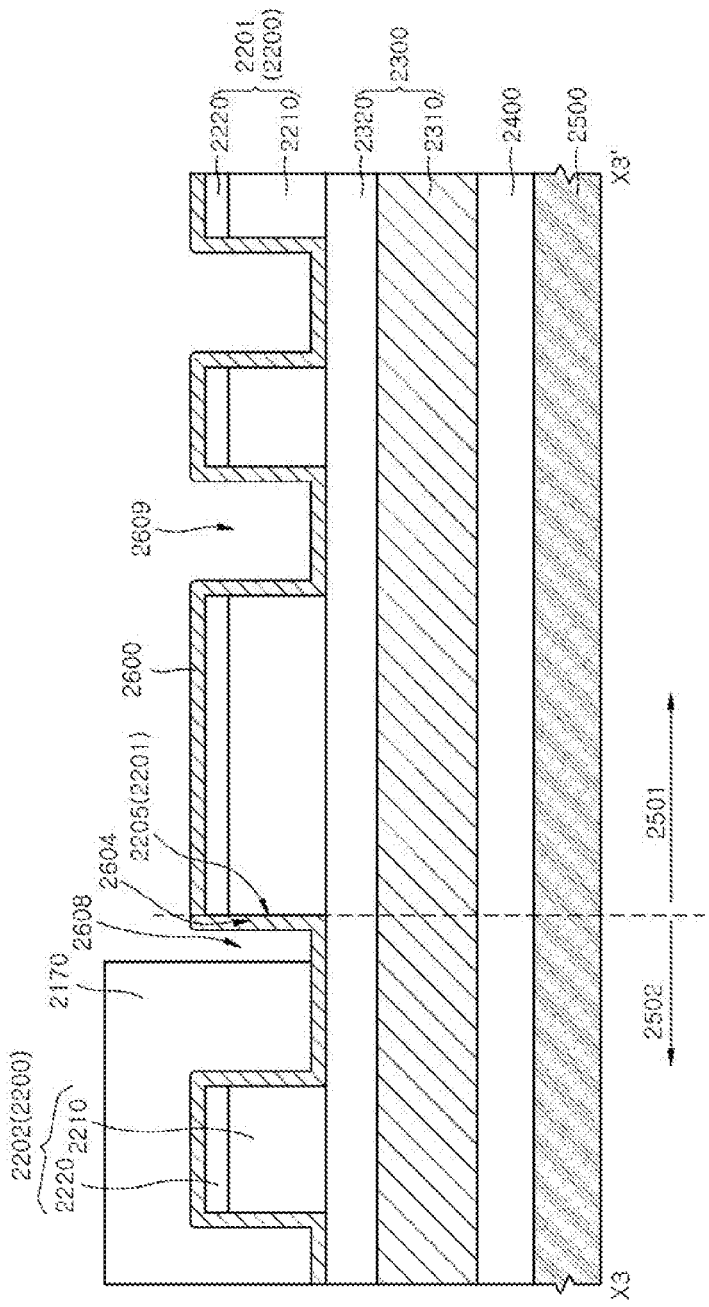

FIG. 27 is a schematic cross-sectional view illustrating a cross-sectional shape in which region blocking pattern 2170 is formed.

Referring to FIG. 27, the region blocking pattern 2170 may be formed on the first spacer layer 2600. The region blocking pattern 2170 may be formed as a pattern that opens the first region 2501 of the semiconductor substrate 2500 and covers to block the second region 2502. The region blocking pattern 2170 may be formed as a pattern that exposes a portion 2604 of the first spacer layer 2600, which is positioned at a boundary between the first region 2501 and the second region 2502 of the semiconductor substrate 2500. The exposed portion 2604 of the first spacer layer 2600 exposed by the region blocking pattern 2170 may be a portion of the first spacer layer 2600 that covers the side surface 2205 of the first buffer layer pattern 2201 facing the second buffer layer pattern 2202. In order to expose the exposed portion 2604 of the first spacer layer 2600, the region blocking pattern 2170 may be formed such that one side surface of the region blocking pattern 2170 is positioned in the concave interspace 2608 provided by the first spacer layer 2600.

The region blocking pattern 2170 may be formed in a photoresist pattern formed by a photolithograph process.

Figure 28:
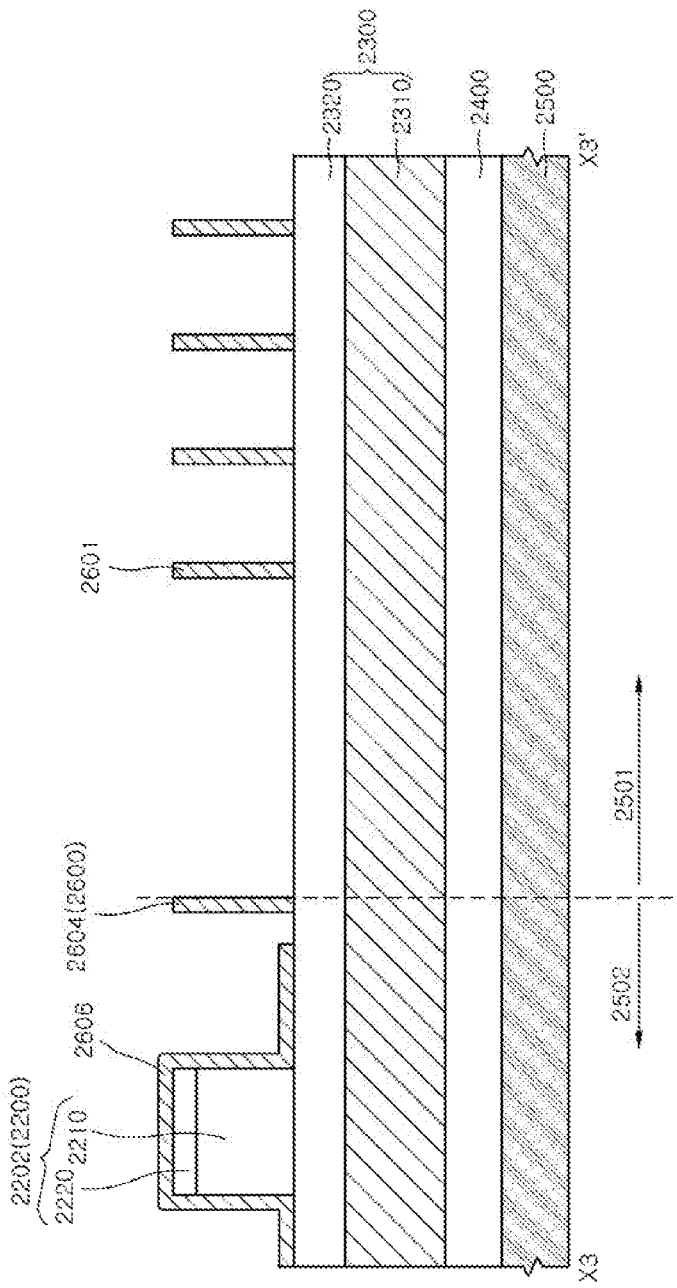

FIG. 28 is a schematic cross-sectional view illustrating a cross-sectional shape in which the first spacers 2601 are separated from the first spacer layer 2600.

Referring to FIG. 28 together with FIG. 27, first sub spacers 2601 may be formed to cover the inner side surface of the first buffer layer pattern 2201. A second sub spacer 2604 may be formed on an outer side surface 2205 of the first buffer layer pattern 2201, which faces the second buffer layer pattern 2202. In addition, a third sub spacer mask 2606 may be formed in a pattern shape covering the second buffer layer pattern 2202. As described with reference to FIG. 5, the first sub spacers 2601 may be separated from the first spacer layer 2600 by performing spacer-etching for the first spacer layer 2600, and in addition, the second sub spacer 2604 and the third sub spacer mask 2606 may be separated from the first spacer layer 2600.

Thereafter, the first buffer layer pattern 2201 which is exposed while the first and second sub spacers 2601 and 2604 are formed may be selectively removed. The process of removing the first buffer layer pattern 2201 may be performed by an etching process substantially the same as the process of selectively removing the buffer layer pattern (201 of FIG. 5). In the etching process of removing the first buffer layer pattern 2201, since the second buffer layer pattern 2202 is blocked by the third sub spacer mask 2606, the second buffer layer pattern 2202 may maintain the pattern shape. As the first buffer layer pattern 2202 is removed, the first sub spacers 2601 may be formed to protrude from the target layer 2300. The first sub spacers 2601 may have a cylindrical shape protruding from the target layer 300, similar to the first spacers 601 illustrated in FIGS. 7 and 8. The first sub spacers 2601 may be formed by substantially the same process as a process of forming the first spacers 601.

Figure 29:
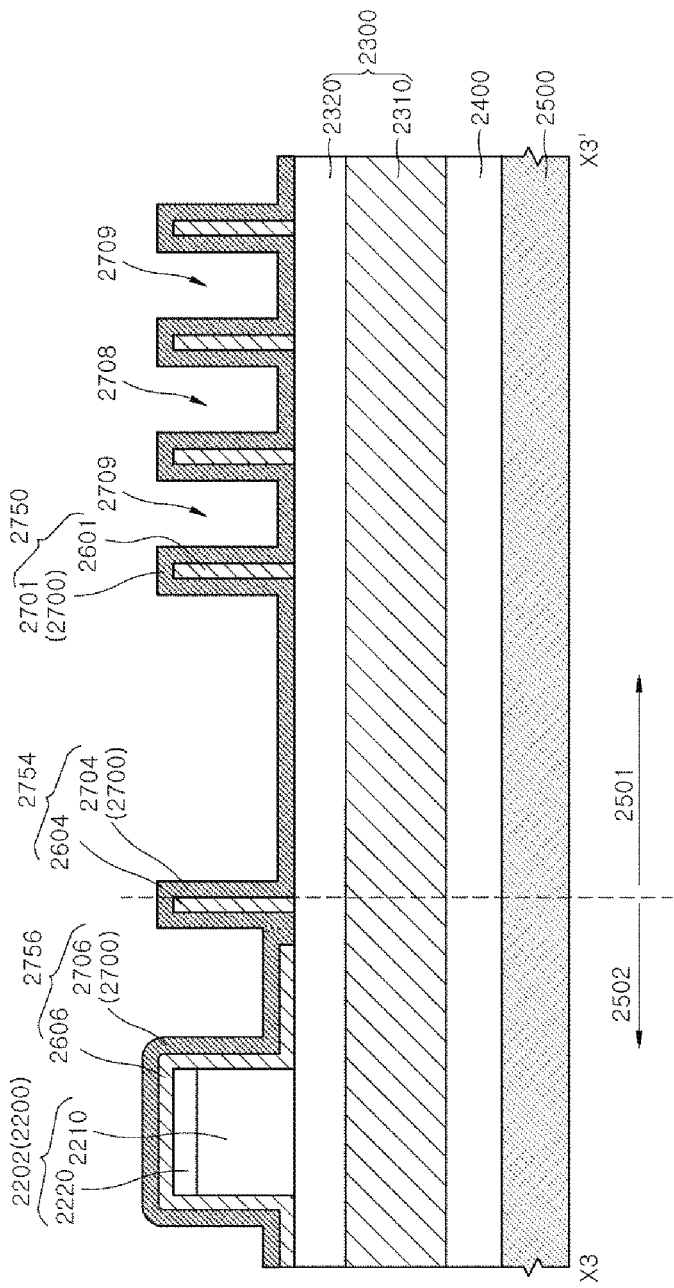

FIG. 29 is a schematic cross-sectional view illustrating a cross-sectional shape in which a second spacer layer 700 is formed to cover the side surfaces of the first sub spacers 2601.

Referring to FIG. 29, the second spacer layer 2700 may be formed to cover the first sub spacers 2601, the second sub spacer 2604, the third sub spacer mask 2606 and the target layer 2300. The second spacer layer 2700 may be formed to cover the resultant structure in which the first sub spacers 2601, the second sub spacer 2604, the third sub spacer mask 2606 are formed on the target layer 2300. The second spacer layer 2700 may be formed by a process substantially the same as the process of forming the second spacer layer 700 described with reference to FIG. 9.

The second spacer layer 2700 may be formed as a layer including a first portion 2701, a second portion 2704 and a third portion 2706. The first portion 2701 of the second spacer layer may be a portion of the second spacer layer covering the first sub spacer 2601, the second portion 2704 of the second spacer layer may be a different portion of the second spacer layer, which covers the second sub spacer 2604, and the third portion 2706 of the second spacer layer may be another different portion of the second spacer layer, which covers the third sub spacer mask 2606. The first portion 2701 of the second spacer layer may form interstitial spaces 2708 between the first sub spacers 2601 and extend to induce inner spaces 2709 inside cylindrical shapes of the first sub spacers 2601. The interstitial spaces 2708 and the inner spaces 2709 provided by the first portion 2701 of the second spacer layer may be formed by a process substantially the same as the process of forming the second inner spaces 709 and the interstitial spaces 708 described with reference to FIG. 10.

Etch masks 2750, 2754 and 2756 may include the first sub spacers 2601, the second sub spacer 2604, the third sub spacer mask 2606, and the second buffer layer pattern 2202. The etching masks 2750, 2754 and 2756 may be used to selectively etch the underlying target layer 2300 to form a target layer pattern. The etch masks 2750, 2754 and 2756 may be divided into a first portion 2750, a second portion 2754, and a third portion 2756. The first portion 2750 of the etch masks may include the first sub spacers 2601 and the first portion 2701 of the second spacer layer. The first portion 2750 of the etch masks may be a pattern substantially the same as the etch mask 750 of FIG. 13. The second portion 2754 of the etch mask may include the second sub spacer 2604 and the second portion 2704 of the second spacer layer. The third portion 2756 of the etch mask may include the third sub spacer mask 2606 and the third portion 2706 of the second spacer layer.

Figure 30:
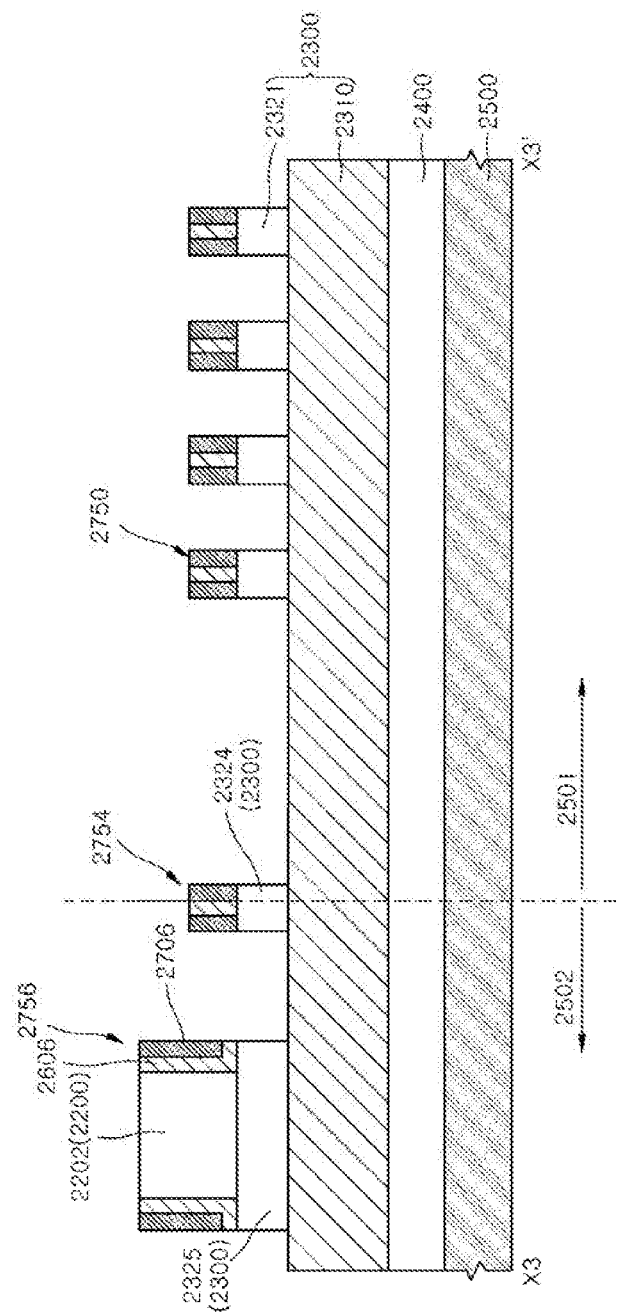

FIG. 30 is a schematic cross-sectional view illustrating a process of etching the target body layer using the etching masks 2750, 2754 and 2756.

Referring to FIG. 30, an etching process may be performed with respect to a resultant structure in which the etch masks 2750, 2754 and 2756 are formed. The etching process may be performed by a process substantially the same as the etching process described with reference to FIGS. 13 and 14. By the etching process, the target capping layer 2320 of the target layer 2300 may be selectively etched to be patterned as a first target capping layer pattern 2321, a second target capping layer pattern 2324, and a third target capping layer pattern 2325. The first target capping layer pattern 2321 may be patterned into a pattern substantially the same shape as the target capping layer pattern 321 of FIG. 14. The second target capping layer pattern 2324 may be patterned into a pattern overlapping the second sub spacer 2604. The third target capping layer pattern 2325 may be patterned into a pattern shape including the second buffer layer pattern 2202, the remaining portion of the third sub spacer mask 2606, which remains on the side surfaces of the second buffer layer pattern 2202, and the remaining portion of the third portion 2706 of the second spacer layer, which remains on the side surfaces of the second buffer layer 2202. The third target capping layer pattern 2325 may be patterned into a pattern substantially overlapping the second buffer layer pattern 2202.

Figure 31:
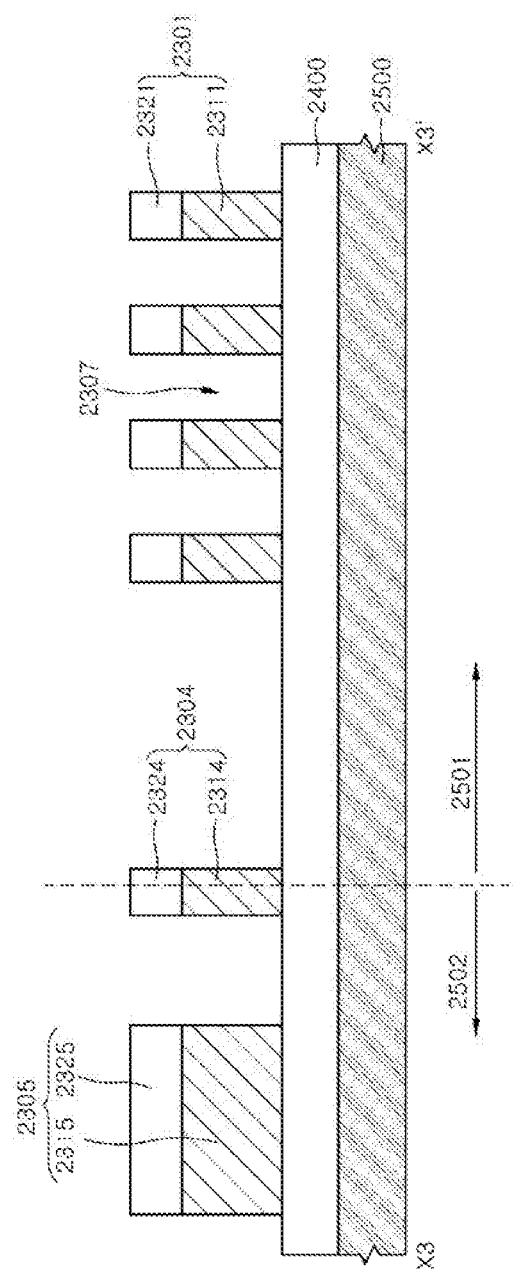
Figure 32:
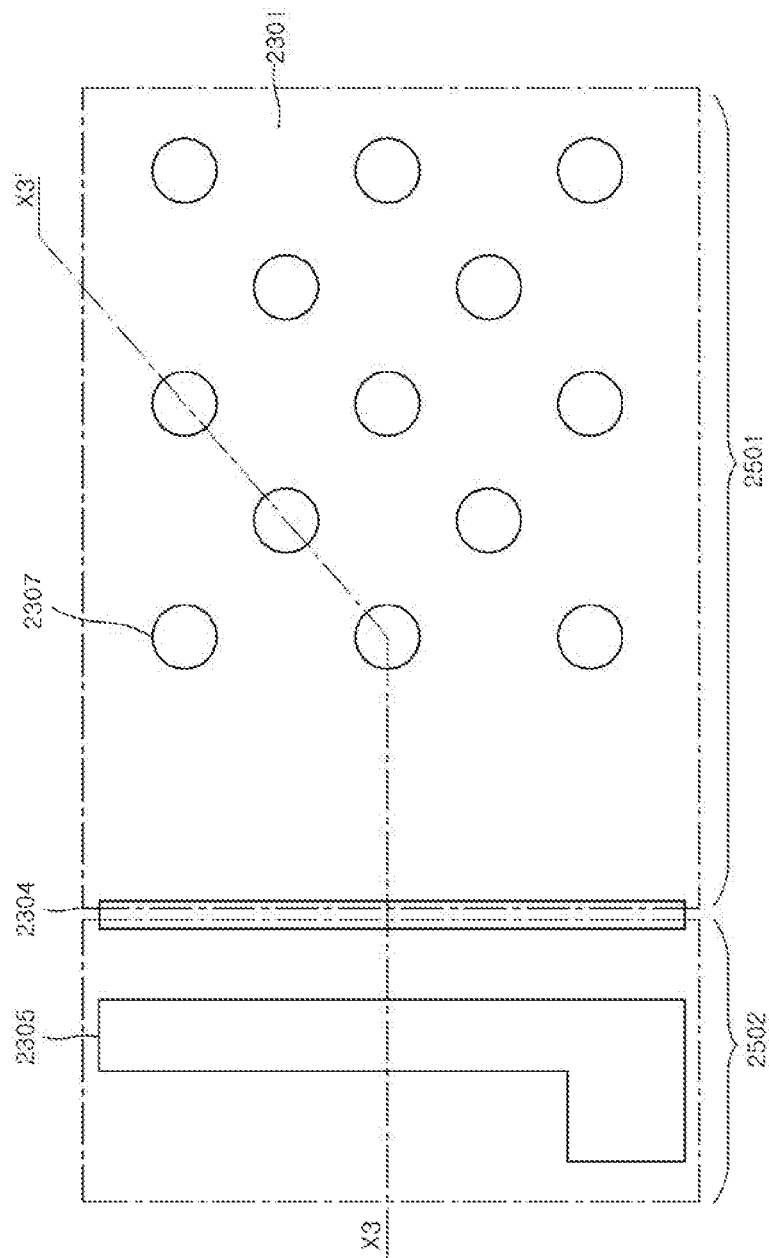

FIG. 31 is a schematic cross-sectional view illustrating a process of forming target body layer patterns 2311, 2314 and 2315. FIG. 32 is a schematic plan view illustrating planar shapes of the target layer patterns 2301, 2304 and 2305.

Referring to FIGS. 31 and 32 together with FIG. 30, an etching process using the etch masks 2750, 2754 and 2756 may be further performed to selectively etch and remove portions of the target body layer pattern 2310, which are exposed by the target capping layer patterns 2321, 2324 and 2325. The target body layer 2310 portions overlapping the first portion 2750 of the etch mask and the first target capping layer pattern 2321 may be patterned into the first target body layer pattern 2311. A first target layer pattern 2301 including the first target capping layer pattern 2321 and the first target body layer pattern 2311 may be formed. The first target layer pattern 2301 may be patterned into a pattern providing first opening portions 2307 as the first opening portions 307 described with reference to FIGS. 15 and 16. The first opening portions 2307 may each be formed in the shapes of through holes densely formed in the first region 2501 of the semiconductor substrate.

Another portion of the target body layer 2310 which overlaps the second portion 2754 of the etch masks and the second target capping layer pattern 2324 may be patterned into the second target body layer pattern 2314. The second target layer pattern 2304 including the second target body layer pattern 2314 and the second target capping layer pattern 2324 may be formed. The second target layer pattern 2304 may be formed as a pattern adjacent to a boundary portion between the first region 2501 and the second region 2502 of the semiconductor substrate, as shown in FIG. 32. The second target layer pattern 2304 may have a pattern shape different from that of the first target layer pattern 2301 providing the first opening portions 2307. The second target layer pattern 2304 may be formed in a line-shaped pattern or a bar-shaped pattern.

Another portion of the target body layer 2310, which overlaps the third portion 2756 of the etch masks and the third target capping layer pattern 2325 may be patterned into a third target body layer pattern 2315. A third target layer pattern 2305 including the third target body layer pattern 2315 and the second target capping layer 2325 may be formed. The third target layer pattern 2305 may be formed in a pattern of a polygonal shape positioned in the second region 2502 of the semiconductor substrate, as illustrated in FIG. 32. The third target layer pattern 2305 may have a pattern shape different from that of the first target layer pattern 2301 providing the first opening portions 2307.

As such, the process of forming the target layer pattern 301 providing the first opening portions 307 illustrated in FIG. 15 may be applied to the process of forming the third target layer pattern 2305 as illustrated in FIGS. 31 and 32.

The above-described pattern forming method, as illustrated in FIG. 23, may include a process of forming the target layer 2300 and the buffer layer 2200 on the semiconductor substrate 2500 including the first region 2501 and the second region 2502. The buffer layer 2200 may be selectively etched to form the first buffer layer pattern (2201 of FIG. 24) providing arrays of the second openings (2209 of FIG. 25) in the first region and the second buffer layer pattern (2202 of FIG. 24) spaced apart from the first buffer layer pattern in the second region. The first spacer layer (2600 of FIG. 26) may be formed on the target layer to cover the first and second buffer layer patterns.

A region blocking pattern (2170 of FIG. 27) may be formed on the first spacer layer to expose the first spacer portion covering the first buffer layer pattern and at least to cover the second buffer layer pattern. The first spacer portion exposed by the region blocking pattern may be etched. The first sub spacers (2601 of FIG. 28) positioned at inner side surfaces of the first buffer layer patterns (2201 of FIG. 27) and having protruding cylindrical shapes, second sub spacer (2604 of FIG. 28) positioned at the outer side surface of the first buffer layer pattern facing the second buffer layer pattern and protruding, and the third sub spacer mask (2606 of FIG. 28) extending at least to cover the second buffer layer pattern may be separated from the first spacer layer. The first buffer layer pattern may be removed.

The second spacer layer (2700 of FIG. 29) may be formed to extend to cover the first and second sub spacers and the third sub spacer mask, to provide the interstitial spaces (2708 of FIG. 29) between the first sub spacers, and to provide the second inner spaces (2709 of FIG. 29) to the first inner spaces of the first sub spacers, respectively. The second spacer layer may be etched to pattern the first target layer pattern (2301 of FIG. 31) providing the first openings (2307 of FIG. 31) formed by extending the second inner spaces and the interstitial spaces in the target layer, the second target layer pattern (2304 of FIG. 31) overlapping the second sub spacer, and the third target layer pattern (2305 of FIG. 31) overlapping the second buffer layer pattern. The first photoresist pattern (2100 of FIG. 23) providing the third openings (2110 of FIG. 23) that open the buffer layer portions on which the second openings (2209 of FIG. 24) are to be formed, and the second photoresist pattern (2150 of FIG. 23) overlapping the second buffer layer pattern (2202 of FIG. 24) may be formed.

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts are not limited to the above descriptions but defined by the accompanying claims, and all of distinctive features in the equivalent scope should be construed as being included in the concepts.

What is claimed is:

1. A method of forming patterns, the method comprising:
    forming a target layer on a semiconductor substrate;
    forming a plurality of first spacers, each of the first spacers having a cylindrical shape protruding from the target layer, the substantially cylindrical shape comprising a substantially annular wall having a substantially constant thickness, the annular wall having an inside surface surrounding a correspondingly elongated void and an outside surface surrounded by void;
    forming a second spacer layer formed to: cover the first spacers, provide interstitial spaces between the first spacers, and provide second inner spaces within first inner spaces of the first spacers; and
    etching the second spacer layer to form first opening portions in which the second inner spaces and the interstitial spaces extend into the target layer.

2. The method of claim 1, wherein the second spacer layer is formed to fill spaced gap portions between at least two first spacers closest to each other among the first spacers.

3. The method of claim 2, wherein the second spacer layer is formed to provide the interstitial spaces between a portion filling the spaced gap portion between the two first spacers closest to each other and other portions.

4. The method of claim 1, wherein the second spacer layer is formed to provide the interstitial spaces at positions substantially equidistant from at least four first spacers adjacent to each other among the first spacers.

5. The method of claim 1, wherein the second spacer layer provides the interstitial spaces such that each of the interstitial spaces is substantially equally spaced from the second inner spaces closest to each other around the interstitial space.

6. The method of claim 1, wherein the second spacer layer is formed to grow in a horizontal direction from an inner surface of the first spacer such that the second inner spaces follow the shape of the first inner spaces and has a size smaller than the size of the first inner space.

7. The method of claim 6, wherein the second spacer layer is formed to grow in the opposite direction from the outer surface of the first spacer while growing in the horizontal direction from the inner surface of the first spacer.

8. The method of claim 1, further comprising:
    forming a buffer layer on the target layer;
    selectively etching the buffer layer to form a buffer layer pattern providing an array of second opening portions;
    forming a first spacer layer covering the buffer layer pattern; and
    etching the first spacer layer to form the first spacers positioned at a side surface of the buffer layer pattern from the first spacer layer.

9. The method of claim 8, wherein the buffer layer pattern provides the second opening portions such that a spaced gap between the second opening portions and adjacent second opening portion is smaller than a radius of the second opening.

10. The method of claim 8, further comprising:
forming a photoresist pattern on the buffer layer, the photoresist pattern providing third opening portions to open portions of the buffer layer in which the second opening portions are to be formed.

11. The method of claim 1, further comprising:
forming a base layer between the target layer and the semiconductor substrate; and
pattern transferring the first opening portions to the base layer using the target layer as an etching mask.

12. The method of claim 11, wherein the base layer is formed of a layer including a different dielectric material from the target layer.

13. The method of claim 12, wherein the base layer includes a polysilicon layer, and
wherein each of the target layer and the buffer layer includes a double layer of a carbon layer and a silicon oxynitride layer.

14. A method of forming a pattern, the method comprising:
forming an array of line patterns on a semiconductor substrate;
forming a base layer covering the line patterns;
forming a target layer on the base layer;
forming a plurality of first spacers, each of the first spacers having a cylindrical shape protruding from the target layer, the substantially cylindrical shape comprising a substantially annular wall having a substantially constant thickness, the annular wall having an inside surface surrounding a correspondingly elongated void and an outside surface surrounded by void;
forming a second spacer layer formed to: cover the first spacers, provide interstitial spaces between the first spacers, and provide second inner spaces within first inner spaces of each of the first spacers, respectively;
etching the second spacer layer to form first opening portions in which the second inner spaces and the interstitial spaces are extended into the target layer, thereby patterning the target layer; and
performing pattern transfer for the first opening portions to the base layer and the line patterns using the target layer pattern as an etching mask.

15. The method of claim 14, wherein in performing pattern transfer for the first openings, some portions of the line patterns are selectively removed to extend the first opening portions so that the first opening portions separate isolated patterns spaced apart from the line patterns.

16. A method of forming a pattern, the method comprising:
forming a target layer and a buffer layer on a semiconductor substrate including a first region and a second region;
selectively etching the buffer layer to form a first buffer layer pattern providing second opening portions in the first region and a second buffer layer pattern spaced apart from the first buffer layer in the second region;
forming a first spacer layer on the target layer to cover the first and second buffer layer patterns;
forming a region blocking pattern exposing the first spacer layer covering the first buffer layer pattern and covering to block the second buffer layer pattern on the spacer layer;
etching the first spacer layer portions exposed by the region blocking pattern to form first sub spacers positioned at inner side surfaces of the first buffer layer pattern and having a protruding cylindrical shape, protruding second sub spacer positioned at an outer side surface of the first buffer layer pattern facing the second buffer layer pattern, and a third sub spacer mask extending from the first spacer layer to at least cover the second buffer layer pattern;
removing the first buffer layer pattern;
forming a second spacer layer formed to cover the first spacers, the second spacer layer providing interstitial spaces between the first spacers and providing second inner spaces within first inner spaces of each of the first spacers, respectively; and
etching the second spacer layer to form a first target layer pattern providing first opening portions formed by extending the second inner spaces and the interstitial spaces, a second target layer pattern overlapping the second sub spacer, and a third target layer pattern overlapping the second buffer layer pattern.

17. The method of claim 16, further comprising:
forming a first photoresist pattern providing third opening portions to open portions of the buffer layer in which the second opening portions are to be formed and a second photoresist pattern overlapping the second buffer layer pattern.

18. The method of claim 16,
wherein the first opening portions are positioned in the first region,
wherein the third target layer pattern is positioned in the second region, and
wherein the second target layer pattern is positioned between the first openings and the third target layer pattern.

19. The method of claim 16,
wherein the third target layer pattern is formed in a polygon pattern having a different shape from the first opening portions.

20. The method of claim 16,
wherein the second target layer pattern is formed in a line pattern having a different shape from the first opening portions.

* * * * *